(12) United States Patent
McKenzie et al.

(10) Patent No.: US 8,946,741 B2
(45) Date of Patent: Feb. 3, 2015

(54) LED WITH ENHANCED LIGHT EXTRACTION

(75) Inventors: James Stuart McKenzie, Falmouth (GB); Majd Zoorob, Southampton (GB)

(73) Assignee: PhotonStar LED Limited, Hants (GB)

( * ) Notice: Subject to any disclaimer, the term of this patent is extended or adjusted under 35 U.S.C. 154(b) by 468 days.

(21) Appl. No.: 12/742,247

(22) PCT Filed: Nov. 10, 2008

(86) PCT No.: PCT/GB2008/003784
§ 371 (c)(1),
(2), (4) Date: May 10, 2010

(87) PCT Pub. No.: WO2009/060227
PCT Pub. Date: May 14, 2009

(65) Prior Publication Data
US 2010/0283075 A1      Nov. 11, 2010

(30) Foreign Application Priority Data

Nov. 9, 2007 (GB) .................................. 0722054.4

(51) Int. Cl.
*H01L 29/72* (2006.01)
*H01L 33/20* (2010.01)
(Continued)

(52) U.S. Cl.
CPC ............. *H01L 33/20* (2013.01); *H01L 33/0079* (2013.01); *H01L 33/22* (2013.01); *H01L 2933/0091* (2013.01)
USPC .................... 257/98; 257/91; 257/95; 257/99

(58) Field of Classification Search
USPC .......................................... 257/91, 95, 98, 99
See application file for complete search history.

(56) References Cited

U.S. PATENT DOCUMENTS

| 5,779,924 A | 7/1998 | Krames et al. |
| 6,015,719 A | 1/2000 | Kish et al. |

(Continued)

FOREIGN PATENT DOCUMENTS

| EP | 1 263 058 | 12/2002 |
| KR | 100 764 403 | 10/2007 |
| WO | 01/91194 | 11/2001 |
| WO | 02/073705 | 9/2002 |
| WO | 2006/096767 | 9/2006 |
| WO | WO 2006/096767 | * 9/2006 |

OTHER PUBLICATIONS

International Search Report and Written Opinion for corresponding International Application No. PCT/GB2008/003784, dated May 29, 2009.

(Continued)

*Primary Examiner* — Edward Wojciechowicz
(74) *Attorney, Agent, or Firm* — Renner, Otto, Boisselle & Sklar, LLP

(57) ABSTRACT

A light emitting device having a plurality of light extracting elements defined on an upper surface of a semiconductor layer of the device, wherein the light extracting elements are adapted to couple light out of the device and to modify the far field emission profile of the device. Each element comprises an elongate region having a length at least twice its width and also greater than the effective dominant wavelength of light generated in the device. The elongate region extends orthogonal to the upper surface but not into the light emitting region of the device and may be oriented at an angle of less than 45° relative to one of a pair of basis axis defining a plane parallel to the semiconductor layer. Each elongate region is spatially separated from neighboring elongate regions such that it perturbs light generated in the light emitting region independently of the neighboring regions.

23 Claims, 16 Drawing Sheets

(51) Int. Cl.
    *H01L 33/00*         (2010.01)
    *H01L 33/22*         (2010.01)

(56) References Cited

U.S. PATENT DOCUMENTS

| | | | |
|---|---|---|---|
| 6,323,063 | B2 | 11/2001 | Krames et al. |
| 6,884,646 | B1 | 4/2005 | Wu et al. |
| 2006/0154389 | A1 | 7/2006 | Doan |
| 2006/0278888 | A1* | 12/2006 | Kim et al. .................. 257/103 |
| 2009/0121243 | A1* | 5/2009 | Erchak et al. ................ 257/96 |

OTHER PUBLICATIONS

Wierer et al., "High-Power AlGaInN Flip-Chip Light-Emitting Diodes," Applied Physics Letters, May 28, 2001, pp. 3379-3381, vol. 78, No. 22.

Schnitzer et al., "30% External Quantum Efficiency from Surface Textured, Thin-Film Light-Emitting Diodes," Applied Physics Letters, Oct. 18, 1993, pp. 2174-2176. vol. 63, No. 16.

Fink et al., "A Dielectric Omnidirectional Reflector," Science, vol. 282, Nov. 27, 1998, pp. 1679-1682.

* cited by examiner

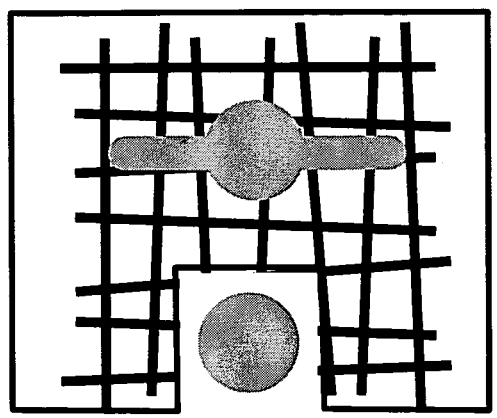 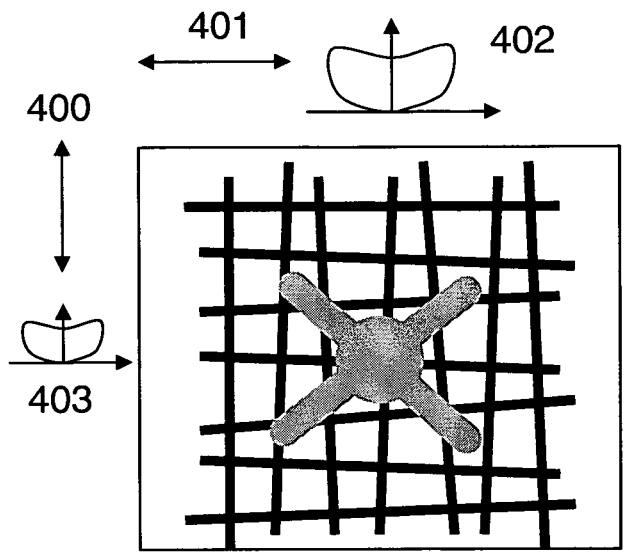
Figure 4a　　　　　　　　Figure 4b
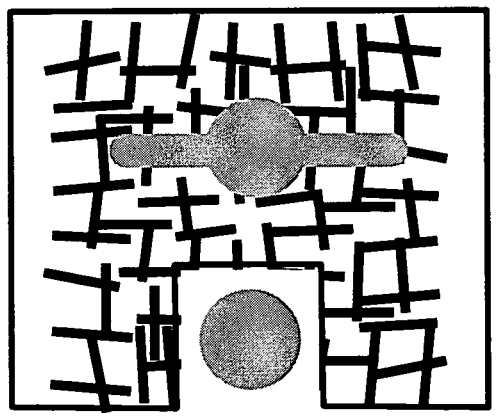 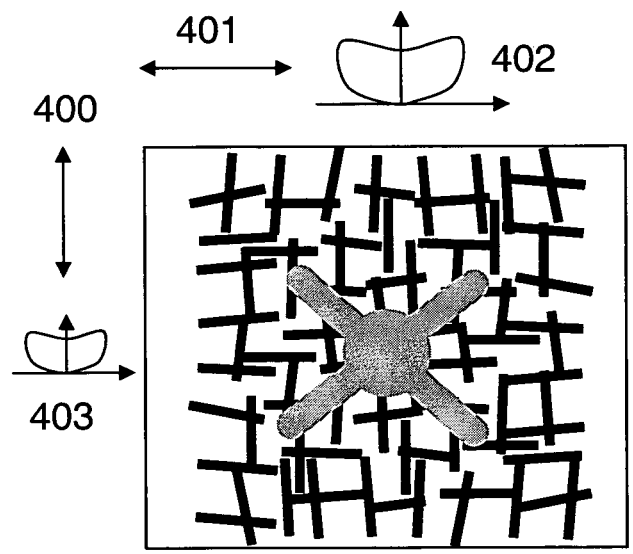
Figure 4c　　　　　　　　Figure 4d

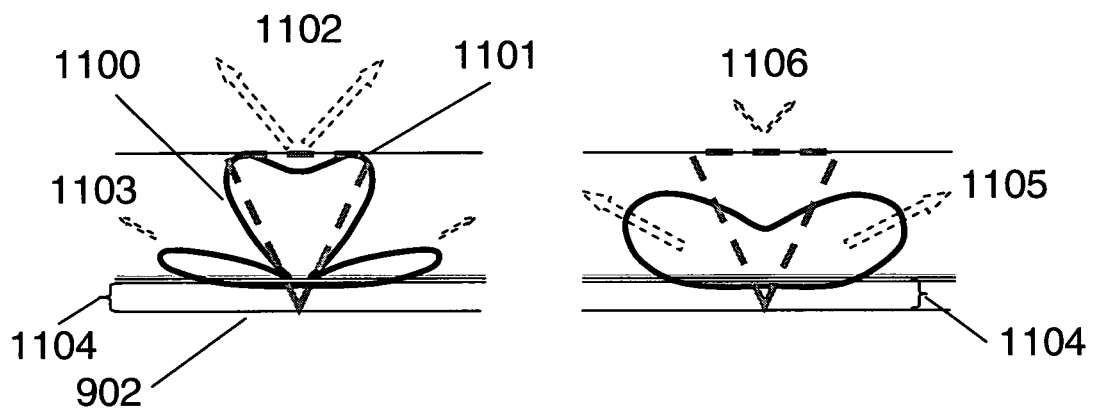
Figure 11a  Figure 11b
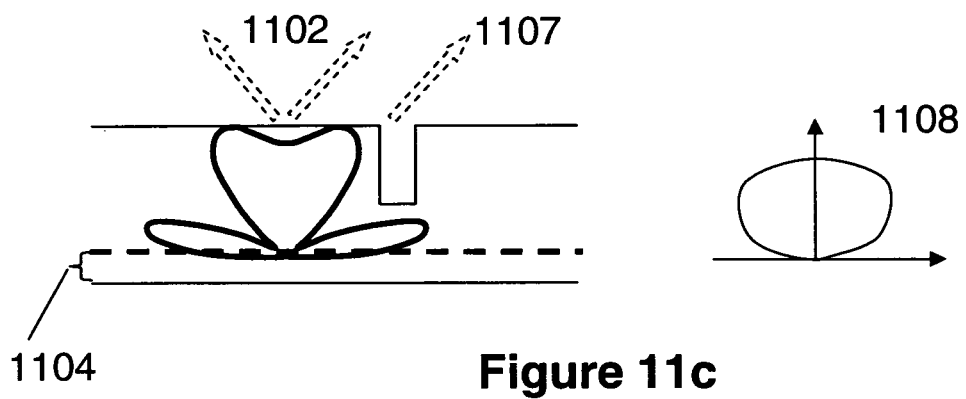
Figure 11c
Figure 11d

LED WITH ENHANCED LIGHT EXTRACTION

This application is a national phase of International Application No. PCT/GB2008/003784 filed Nov. 10, 2008, and published in the English language as WO 2009/060227 on May 14, 2009.

FIELD OF THE INVENTION

The present invention relates to Light Emitting Devices and Light Emitting Diodes (LEDs) having surface patterning for improved light extraction and far field profile and to a method of manufacturing the devices.

BACKGROUND TO THE INVENTION

Light emitting devices and diodes are based on a forward biased p-n junction. LEDs have recently reached high brightness levels that have allowed them to enter into new solid state lighting applications as well as replacements for high brightness light sources such as light engines for projectors and automotive car headlights. These markets have also been enabled by the economical gains achieved through the high efficiencies of LEDs, as well as reliability, long lifetime and environmental benefits. These gains have been partly achieved by use of LEDs that are capable of being driven at high currents and hence produce high luminous outputs while still maintaining high wall plug efficiencies.

Solid state lighting applications require that LEDs exceed efficiencies currently achievable by alternative incandescent and fluorescent lighting technologies. The efficiencies of LEDs can be quantified by three main factors, internal quantum efficiency, injection efficiency, and the extraction efficiency. The latter being the basis for the present invention. Several other factors affect the overall efficiency of solid-state lighting applications, including phosphor conversion efficiency and electrical driver efficiency. However, these are beyond the scope of the present invention.

One of the main limiting factors reducing the extraction efficiency in LEDs is the emitted photons being totally internally reflected and trapped in the high refractive index of the epi-material. These trapped waveguide-modes propagate in the LED structure until they are scattered, escape or reabsorbed. The thickness of the light emitting structure determines the number of modes that can be set up. Many methods have been successfully employed to improve light extraction in LED heterostructures. These include shaping LED die, as described in U.S. Pat. No. 6,015,719 and U.S. Pat. No. 6,323,063, flip-chip mounting of LEDs as described by Wierer et al. in Appl. Phys. Lett., 78, Pg. 3379, 2001, roughening of the top surface as taught by Schnitzer et al in Applied Physics Letters 63, 2174, 1993, and the use of omnidirectional reflectors as suggested by Fink et al. in Science vol. 282, Pg. 1679, 1998. Other methods suggested include the use of periodic texturing on at least one interface of the structure to improve light extraction out of the light emitting region, as described in U.S. Pat. No. 5,779,924.

To provide light emitting devices with high current and thermal driving capabilities, the vertical type n-p contact configuration in GaN material systems has also been adopted recently. Such examples have been disclosed in U.S. Pat. No. 6,884,646 and published U.S. Patent application 20060154389A1. However, one major drawback with such vertical type light emitting structures is the existence of optically lossy metal contacts in the close vicinity of the light emitting heterostructure. Trapped modes in the high index light emitting device typically undergo multiple internal reflections. The photons reflected at the interface between the metallic contact surface and the heterostructure material experiences large losses, thereby reducing the total light output of the light emitting diode.

Back Light Units (BLU) for LCD panels are key elements to the performance of an LCD panel. Currently, most LCD panels employ compact cathode fluorescent light (ccfl) sources. However, these suffer from several problems such as poor colour gamut, environmental recycling and manufacture issues, thickness and profile, high voltage requirements, poor thermal management, weight and high power consumption. In order to alleviate these problems LCD manufacturers are implementing LED BLU units. These offer benefits in improved light coupling, colour gamut, lower power consumption, thin profiles, low voltage requirements, good thermal management and low weight.

Another application for LED modules is in light engines for front and rear projectors. Conventional High Intensity Discharge (HID) type projector light engines have always been hindered by low efficiency and short lifetime resulting in slow adoption into consumer markets.

Thus, there are a wide range of applications for LED modules, if the problems limiting the efficiency can be alleviated. There is therefore a need for a more efficient design of LED, which can achieve the performance levels required for this type of solid state lighting device to replace more conventional sources.

SUMMARY OF INVENTION

According to a first aspect of the present invention, a light emitting device comprises:
a first semiconductor layer having doping of a first type;
a second semiconductor layer having doping of a second type;
a light emitting region interdisposed between the first and the second semiconductor layers, wherein light generated in the light emitting region is extracted from the device via an upper surface of the second semiconductor layer and includes a dominant wavelength having an effective wavelength in the device,
a first electrode disposed on the first semiconductor layer;
a second electrode disposed on the second semiconductor layer; and,
a first plurality of light extracting elements defined on an upper surface of the second semiconductor layer, the light extracting elements being adapted to couple light out of the device and to modify the far field emission profile of the device, wherein
each of the light extracting elements comprises an elongate region having length, width and depth dimensions such that the length of each region is at least twice the width of the region and is also greater than the effective dominant wavelength of the generated light, and such that the depth of the region extends orthogonal to the upper surface of the second semiconductor layer but does not extend into the light emitting region;
each elongate region has its length dimension oriented at a detuning angle relative to one of a pair of basis axes defining a plane parallel to the second semiconductor layer, the magnitude of the detuning angle being greater than or equal to 0 degrees and less than 45 degrees; and,
each elongate region of the first plurality of elements is spatially separated from neighbouring elongate regions in the first plurality such that it perturbs light generated in the light emitting region independently of the neighbouring regions.

Light emitting diodes typically suffer from poor light extraction due to the high refractive index of the light generating material, which results in the trapping of spontaneously emitted light. It is the object of the present invention to provide a novel top surface light extraction technique that allows the largest amount of light out of the light emitting structure on the first pass of light incident on the top surface. This is especially critical in order to reduce the recombination rate of trapped photons and hence improve the overall efficiency of the light emitting device.

The object of the present invention is achieved by the introduction of an distributed network of substantially elongate indentations or etches on the top emission surface of a light emitting device to allow for efficient light extraction. The absolute location of the elongate light extracting elements (ELEE) is randomly defined but the rotational symmetry is defined along a substantially orthogonal or non-orthogonal 2-fold basis axis. Preferably, the network of elongate elements is evenly distributed.

The light extracting elements are at least larger than the effective wavelength of light in the medium. Moreover, the elongate edge of the element is at least twice that of the short edge. This enables a substantial difference in optical perturbation between the 2-fold basis axes of the light extracting elements, thereby allowing alterations to the far field emission.

The depth of the ELEE patterned on the light emitting device is allowed to extend down into the semiconductor material, but not penetrate into the light emitting region of the device. The depth of the ELEE determines the coupling strength between the scattering ELEE centres and the trapped waveguide modes of the light emitting device.

In one embodiment of the present invention, the depth of the ELEE are tailored to provide tunability in the extraction coupling length and the resulting elevation angle of emission for light extracted from the device.

In one embodiment of the present invention, the ELEE are arranged so that the longer edges are substantially parallel to each other along one of the basis axes. This allows the far field profile to exhibit a largely elliptical emission along the azimuthal axis.

In another embodiment of the present invention, the ELEE are arranged substantially parallel along two basis axes, either orthogonal or non-orthogonal. This allows the far field profile to exhibit a largely isotropic emission along the azimuthal axis, but a substantially wider emission than a Lambertian emitter in the elevation axis.

Preferably, the ELEE is disposed on the top surface of a light emitting device with a vertical type current path. The top n-contact and bottom p-contact of the device further comprise a transparent electrically conductive multilayer stack and a metal reflector optimised to exhibit at least 50%, preferably at least 75%, more preferably at least, 90%, even more preferably at least 95%, and most preferably at least 98% reflectivity for light incident back into the light emitting device, thereby reducing optical losses associated with light reflecting from the n and p metal contacts.

In one embodiment of the present invention the ELEE are arranged so that the elongate elements associated with the different basis axes overlap to form a complex network of crossed elongate elements.

Preferably, the semiconductor surface of the light emitting device is roughened, in addition to the presence of the ELEE. This allows the far field profile to exhibit a largely isotropic emission along the azimuthal axis as well as an elevation profile closer to the ideal Lambertian. In this embodiment the etch depth of the ELEE are preferably greater than those of the roughened features.

Preferably, the light emitting device is grown on a regularly patterned substrate to reduce thread dislocation densities of the semiconductor crystal growth as well as increase the diffuse reflectivity for light trapped in the light emitting device core region and thereby increase the probability of the light being extracted from the top extracting surface.

In one embodiment of the present invention, the ELEE are disposed on a light emitting device with a vertical type current path, wherein the light emitting region is interspaced between the light extracting elements and the mirror of the bottom metal electrode. The mirror may be optimised to achieve an optical cavity effect. The etch depth of the ELEE can be much deeper than in the case of a lateral type LED, which in turn permits greater light extraction efficiency.

Where an optical cavity is employed, it can be designed to be non-optimal and thereby improve coupling of generated light back into guided LED modes. This is typically not desirable in a conventional vertical LED design, which employs surface roughening for light extraction. In this case, the energy is redistributed between the different guided modes and more energy is coupled into lower order waveguide modes. However, in order to improve the light extraction, a preferred embodiment of the present invention allows the guided modes to be extracted using the ELEE deep indentations. In this case, the light is extracted at much shallower elevation angles with respect to the top surface of the LED, which in turn allows the ELEE to steer the light out of the LED into profiles that exhibit substantially non-Lambertian emission in the elevation angle.

In a preferred implementation of the invention, a light emitting device with FLEE elements on the top surface further comprises a roughened layer disposed between the light emitting region and the reflecting mirror in a vertical type light emitting device.

In another preferred implementation of the invention, the light extraction capabilities of the ELEE elements are further improved by disposing scattering elements inside the FLEE elements. These may comprise one or more of colloids, nanospheres, nanorods or nanoclusters.

In another modification to the present invention, the mesa side walls of the light emitting device are textured to improve light extraction. In one embodiment the mesa texturing is only introduced on two parallel facing sides. This enables improved non-symmetrical emission and accentuates the ellipticity of the profile in the azimuthal axis of the light emitting device, even when the device is of substantially square shape. In another embodiment the mesa sidewalls are textured on all four sides to enhance the isotropic azimuthal emission profile of the light emitting device.

In a preferred embodiment of the present invention, the light extracting elements are introduced on the surface of a substantially polarised light emitting device, such as a non-polar GaN light emitting device. In the preferred embodiment the ELEE elements are optimised to extract one polarisation such as the TE polarised waveguide mode. The selected polarisation is matched with the emission of light emitting device and allows improved light extraction.

In describing the present invention, reference is made to InGaN light emitting diodes as an example. However, the implementation of the present invention can be employed in other III-V or II-IV group light emitting material systems, such as, but not restricted to, InGaAs, InGaP, ZnO, as well as other electrically pumped material systems, such as organic LEDs, rare-earth doped, and Silicon rich Silicon oxides and nitrides.

According to a second aspect of the present invention, a method of manufacturing the devices of the first aspect comprises the steps of:

growing each of a second semiconductor material, a light emitting region, and a first semiconductor material;
depositing a first contact layer;
forming mesa isolation trenches in the light emitting device;
depositing a first electrode;
attaching a sub-mount;
removing growth substrate;
depositing a second contact layer;
defining light extraction elements on the top surface of the second semiconductor layer by patterning; and
separating an isolated light emitting die.

Preferably, the light extraction elements are defined by forming a pattern using a method selected from a group which comprises conventional photolithograpahy, UV, deep UV, and X-ray lithography and non-photolithographic techniques including nano-imprinting and colloidal templating; and,
performing a dry or wet etch.

The location and rotation orientation of the ELEE elements is defined during the patterning step.

BRIEF DESCRIPTION OF THE DRAWINGS

Examples of the present invention will now be described in detail with reference to the accompanying drawings, in which:

FIGS. 4a-d show a schematic plan view of example light emitting devices of both lateral and vertical current flow type with an array of crossed elongate light extraction elements;

FIGS. 11a-b show a schematic of the cross sectional view of an example light emitting device comprising an optical waveguide structure, together with the dipole emission profile inside the light emitting device when the optical cavity is optimized, respectively, for maximum light and minimum light in the escape cone.

FIGS. 11c-d show a schematic of the cross sectional view of an example light emitting device comprising an optical waveguide structure, together with the dipole emission profile inside the light emitting device when the optical cavity is optimized, respectively, for maximum light and minimum light in the escape cone. Also shown is the associated far field emission profile for the respective structures;

DETAILED DESCRIPTION

Figure 1A:
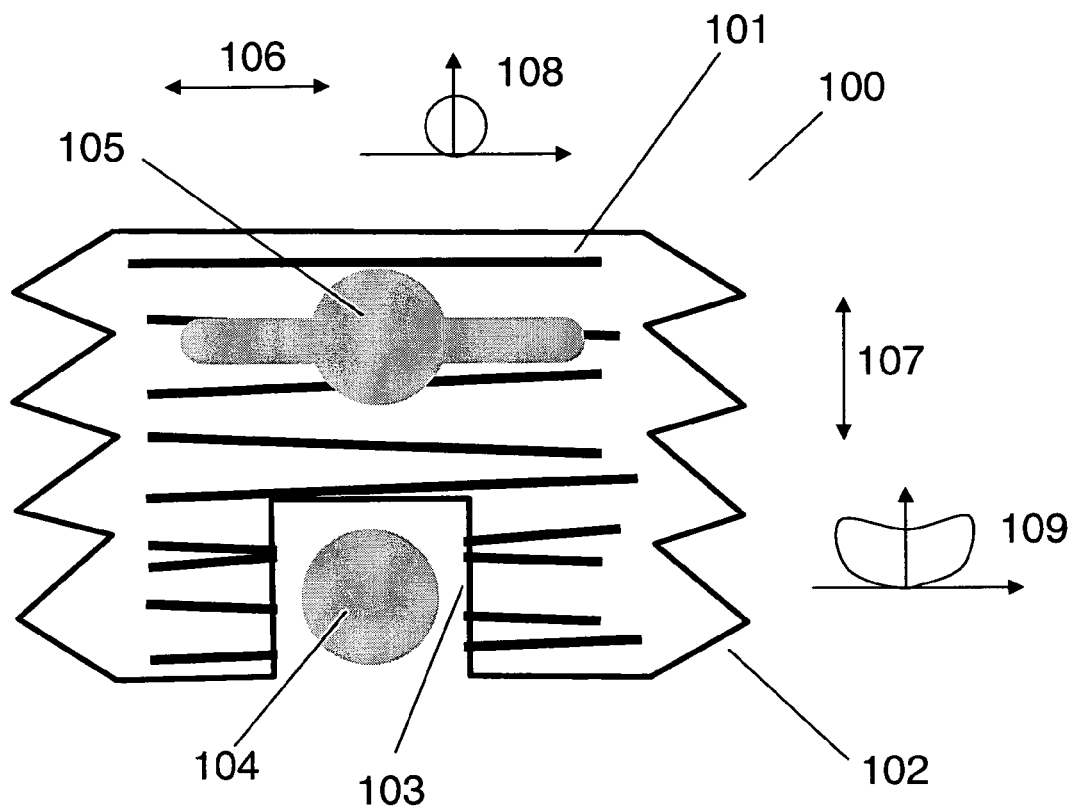
FIGS. 1a-b show a schematic plan view of light emitting devices of a lateral current flow type with elongate light extraction elements of the present invention.

The object of the invention is to provide a high luminous output semiconductor light emitting device while still maintaining high wall plug efficiency. The invention can be incorporated in a light emitting device fabricated from any semiconductor material system, such as, but not restricted to, InGaN, InGaP, InGaAs, InP, and ZnO. A GaN based light emitting diode (LED) having an epitaxial layer formed on a sapphire substrate is used as an example for illustrating the present invention. However, the present invention is not restricted to epitaxial layers grown on sapphire and may include Si, SiC, Ge, native free-standing GaN, AlN, LiAlO or any other growth and substrate technology. Another object of the invention is the use of LEDs with a vertical current path, in which the electrical current through the p and n doped materials is applied through substantially parallel contacts that allow the current to flow in a vertical direction through the LED structure. These LED structures are sometimes also termed, thin film, thin GaN or free standing GaN LEDs.

GaN light emitting devices comprise a p-n junction heterostructure having a refractive index of about 2.45. When the light emitting device is forward biased, spontaneously emitted photons are generated. If the wavevector of the photon resides below the light line (in a frequency-wavevector diagram) of the material, then the photon is totally internally reflected and trapped in the high refractive index of the epi-material.

Table 1 lists the approximate extraction enhancement achieved when employing the different techniques commonly employed to extract light from the top surface of an unpackaged vertical LED. The numbers describe the multiplicative factor above a reference bare unroughened light emitting device. The numbers are based on an example structure, whereby the mirror is assumed to be 100% reflective and the location of the multiple quantum well (MQW) is optimised to direct most of the light within the light line of the structure and to achieve a cavity type effect. Only about 4.35% of the light is extracted out of the top surface of a bare unroughened LED.

TABLE 1

| Extraction technique | Extraction enhancement |
|---|---|
| Mirror | 2.0 |
| Microcavity | 1.75 |
| Roughening techniques | 2.5 |

The object of the present invention is to provide a means of increasing the extraction enhancement in a light emitting device of both the lateral and the vertical type current flow. This is achieved by applying ELEE elements to the top surface of a light emitting device with the aim of further increasing the light extraction by a factor in the range of ×1 to ×2.6, and possibly higher, over that achieved by known roughening techniques.

For the purposes of an calculating extraction efficiency, if a light emitting device with a perfectly smooth semiconductor top and bottom surface (of refractive index $n_{GaN}$) suspended in an encapsulating medium of refractive index $n_{encap}$ is assumed, then the extraction efficiency $\eta_{extract}$ of light trapped inside the light emitting device is given by $$\eta_{extract} = 1 - \cos\left(\sin^{-1}\left(\frac{n_{encap}}{n_{GaN}}\right)\right) \quad (1)$$

For a GaN blue light emitting diode ($n_{GaN}$=2.45) in air the light extraction efficiency is typically computed to be 8.7%.

In order to allow for efficient light extraction, an evenly distributed network of substantially elongate indentations or etches is introduced to the top emission surface of a light emitting device. The absolute location of the elongate light extracting elements (ELEE) is randomly defined, but the rotational symmetry is defined along a substantially orthogonal 2-fold basis axis. The rotational angle is defined as the angle formed between a projection line extending along the elongate edge of the element and the said axis. It is preferred that the ELEE elements are separated on average by at least a minimum of 1.0 micron, more preferably 1.5 micron, even more preferably 2.0 micron, still more preferably 5.0 micron, and most preferably 10.0 micron.

The elongate light extraction elements (ELEE) are at least larger than one integer effective wavelength in size. Preferably, the elongate edge of the element is at least two times longer, more preferably at least 3 times longer, at least 4 times longer, or at least 5 times longer, and most preferably at least 10 times longer than the short edge. This is to enable a substantial difference in optical perturbation between the 2 basis axes along the two edges of the light extracting elements and thereby allow for tunability in the far field emission of the light emitting device across different azimuthal angles.

Figure 1B:
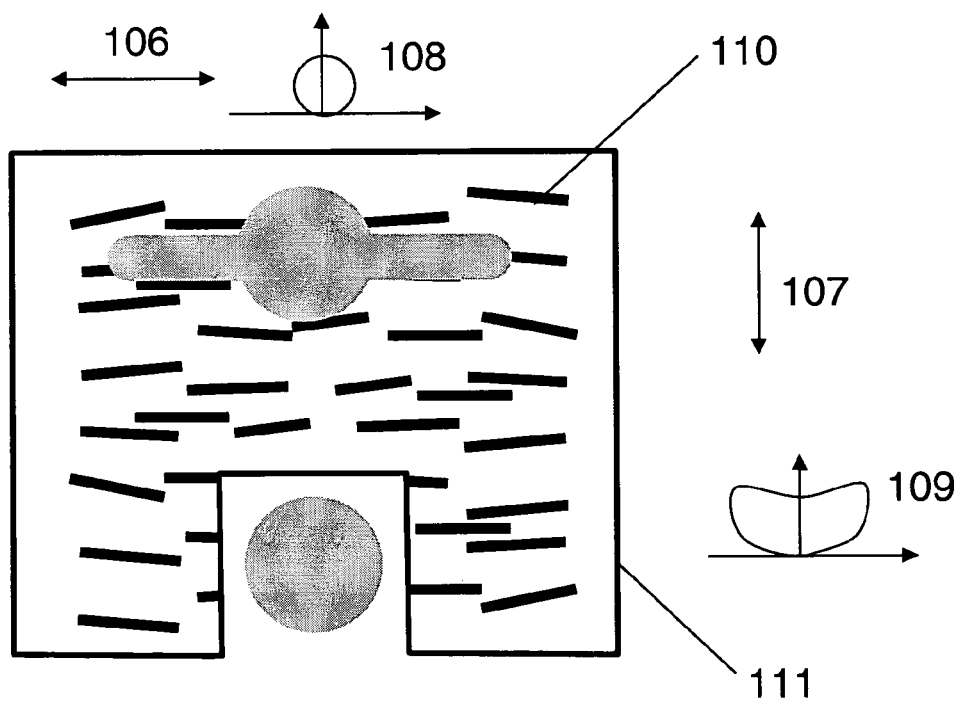

FIGS. 1a and 1b highlight a plan view of an example light emitting device 100, with ELEE elements, 101 and 110 embedded or indented on the top emitting surface of the device in accordance with the present invention. In the case of FIG. 1a, the elongate elements reside along a substantially parallel plane as depicted in 101. The rotational orientation of the ELEE elements can be detuned from the main axes to further improve light extraction of trapped optical modes propagating along different in-plane wave vector directions. In the present example, the light emitting device possesses a lateral current flow from the bottom n contact, 104, that resides in an etched mesa trench, 103, and is in contact with the n-doped semiconductor region, to the top p contact region 105 that resides on the top surface of the light emitting device and is contact with the p-doped semiconductor region. The light emitting region resides between the n-doped and the p-doped semiconductor regions. The electrodes for the p contact, 105, and the n contact, 104, are both designed to provide improved current spreading across the complete surface of the light emitting device. This may be further improved by the introduction of a current spreading layer over the top surface of the light emitting device. Such layer may comprise materials including Ni/Au, Pd or a transparent conductive oxide or nitride such as Indium Tin Oxide (ITO) or Al doped ZnO (AZO), but is not limited to these.

As it is primarily an object of the present invention to provide a method of improved light extraction, methods of improving current spreading and/or the internal quantum efficiency of the light emitting device are generally beyond the scope of the present invention. However, it is assumed that light emitting devices with improvements in current injection and internal quantum efficiency may also benefit by use of the ELEE elements to further increase the extraction efficiency of the device.

In the present invention, the light extracting elements are at least larger than the effective wavelength of light in the device. Moreover, the elongate edge of the element has at least twice the length of the short edge. This is to enable a substantial difference in optical perturbation between the 2-fold basis axes of the) light extracting elements and thereby allow alterations to the far field emission from the device.

The depth of the ELEE patterned on the light emitting device is allowed to extend down into the semiconductor material, but is not allowed to penetrate into the light emitting region of the device. The depth of the ELEE determines the coupling strength between the scattering ELEE centres and the trapped waveguide modes of the light emitting device. It is also important to note that by tailoring the depth of the ELEE patterning, tunability in the extraction coupling length and the resulting elevation angle of extracted emission may be achieved.

The ELEE elements are not allowed to penetrate the light emitting region in order to reduce the surface damage that may be caused during etching of the ELEE indentations. It is an aim of the present invention to avoid etching very close to the light emitting region in order to avoid poor current spreading. It is another aim of the present invention that light extraction arises from individual ELEE elements and not the combined interaction between neighbouring elements, as is the case when using more complex light extraction techniques such as diffraction gratings and photonic crystal structures. An advantage arising from the use of ELEE elements with the lack of interaction between neighbouring elements is that of allowing the etch depth to be independent of any undesirable effective reflection effects. This effect may arise in light extraction techniques of the prior art such as roughening or photonic crystal type light extraction, where regions with a dense distribution of interacting light extracting features form an average effective medium with a reduced refractive index when compared to the semiconductor material and hence may introduce a reflection coating type phenomenon.

As shown in FIG. 1a, in one embodiment of the invention, the ELEE elements 101 extend a significant distance across the top emitting surface of the light emitting device. Preferably, the length of the elements is greater than at least a ⅛, more preferably ⅙, and most preferably ¼ of the length of the active light emitting device. However, as shown in FIG. 1b, in another embodiment of the invention, the ELEE elements 110 extend a substantially shorter distance across the top emitting surface of the light emitting device. Preferably, the length of the elements is less than 1/8, more preferably 1/6, and most preferably 1/4 of the length of the active light emitting device.

It is important to note that an even coverage of ELEE elements across the surface of the LED provides for improved light extraction uniformity across the surface of the light emitting device. Additionally, it is also important to maintain the high aspect ratio of length to width of the individual ELEE elements, in order to provide the improved anisotropic nature of the far field emission of the extracting elements.

Figure 2:
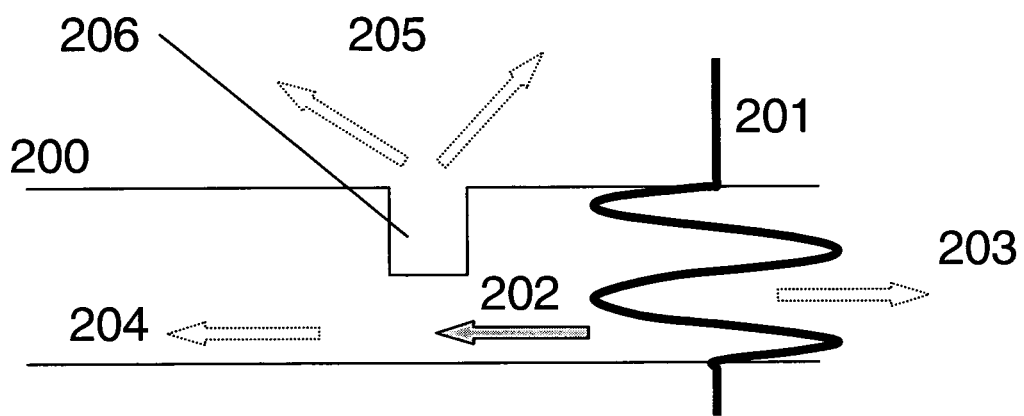
FIG. 2 shows a schematic cross sectional view of an example light emitting device with elongate light extraction elements and a third order TE2 mode trapped in the light emitting device.

During operation, all light that is emitted outside the escape cone of the semiconductor material and the surrounding medium is trapped. However, as shown in FIG. 2, the ELEE elements, 206, introduce an effective refractive index impedance mismatch for the propagating waveguide modes, 201, thus allowing the light to scatter out of plane, 105, and thereby escape to the surrounding medium. The strength of out-of-plane scatter is an interplay between the power of the in-plane incident light, 202, in each trapped waveguide mode, the resultant in-plane back reflected, or scattered light, 203, the in-plane forward scattered or transmitted light, 204, and the out-of-plane scattered or diffracted light, 205. The percentage of light coupled into any of these mechanisms can be controlled by varying the properties of the ELEE elements, 206, and the waveguiding properties of the light emitting device. Such properties may include the shape, dimensions, and refractive index of the ELEE elements, and the thickness and refractive index of the optical waveguiding structure of the light emitting device.

In another modification to the present invention, the mesa side walls of the light emitting device are textured to improve light extraction, as shown in 102. Light that is trapped in the light emitting device may experience multiple reflections guiding the photons to the periphery of the mesa device. In order to eliminate any further reflections off the mesa sidewalls, the presence of a corrugated surface introduces multiple non-normal sidewalls, thereby increasing the probability of light extraction.

If textured mesa sidewalls are only introduced on two parallel facing sides, then further improvements in the non-symmetrical emission of the light emitting devices are achieved. The pre-defined textured sidewalls accentuate the ellipticity of the profile in the azimuthal axis of the light emitting device, even when the device is of a substantially square shape. The light extraction is increased from a textured sidewall and so the elliptical extremities of the far field profile will tend in the direction of the textured sidewalls. In another embodiment, the mesa sidewalls are textured on all four sides to enhance the isotropic azimuthal emission profile of the light emitting device.

In one embodiment of the present invention the ELEE are arranged so that the longer edges are substantially parallel to each other along one of the basis axes, as shown in FIG. 1a. This allows the far field profile to exhibit a largely elliptical emission profile in the azimuthal axis. The emission cross section profile along the axis perpendicular to the elongate edge of the ELEE element, as indicated by 107, is typically less collimated than a Lambertian emitter, while also providing improved light extraction, as shown in the polar plot insert 109. When the emission cross section profile is parallel to the elongate edge of the ELEE elements, as shown in 106, the light extraction is reduced, but comprises a substantially more Lambertian emission profile, as shown in the polar plot insert 108.

This flexibility in tailoring the far field allows light emitting devices of the present invention to be employed in many different applications, such as those where a wider emitting far field pattern is desirable as compared to a Lambertian profile. Light emitting devices of the present invention may be beneficial in applications such as LCD back light units (LCD BLU), where the wide emission profile improves the illumination uniformity across the LCD panel. Additionally, ELEE elements are substantially easier to fabricate, as compared to light extraction techniques of the prior art such as regular photonic crystal arrays of etched holes, and can be fabricated using conventional photolithography and imprint techniques, as the elements do not require sub 0.5 micron resolution patterning techniques.

Figure 3A:
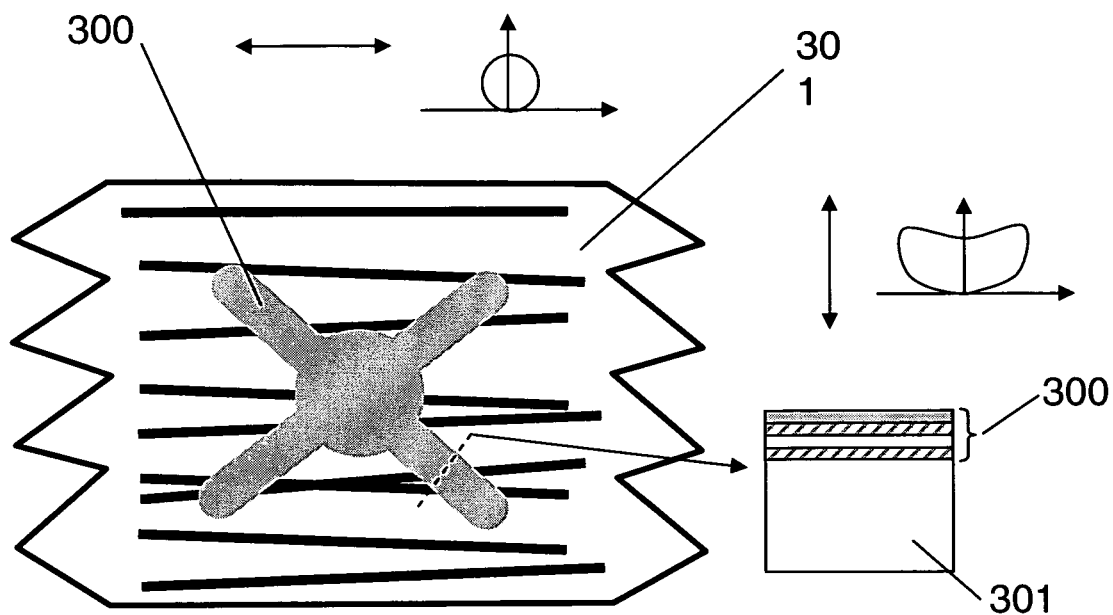
FIGS. 3a-b show a schematic plan view of example light emitting devices of a vertical current flow type with elongate light extraction elements according to the present invention.
Figure 3B:
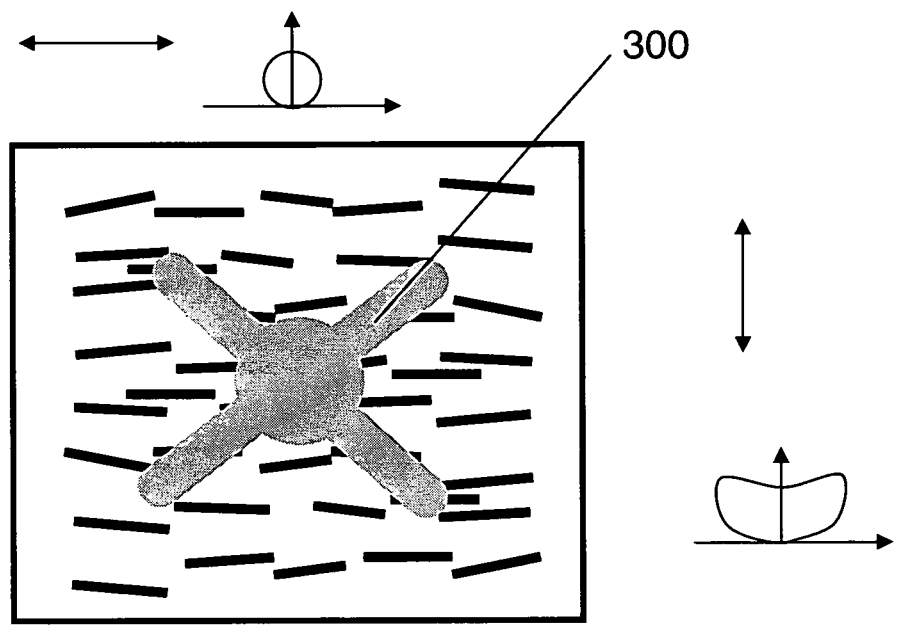

In a preferred application of the present invention, the ELEE are incorporated on the top surface of a vertical type current injection light emitting device, as shown in FIGS. 3a and 3b. In the case of a light emitting diode, the top semiconductor surface typically comprises an n-doped semiconductor material. Such a structure is typically fabricated by use of a flip chip or wafer bonding process onto a carrier substrate with subsequent growth substrate removal. Such wafer processing enables the thick n-doped semiconductor material to be top surface exposed. This is beneficial for the present invention, as the ELEE elements can penetrate deeper into the light emitting device without adversely affecting current spreading, and without increased surface recombination or active region damage. The current path for such vertical type light emitting devices requires only an n type contact to be present on the top light extracting surface of the light emitting device, while the p contact surface resides beneath the p-doped semiconductor material and typically also acts as a high reflectivity optical mirror across the complete p-doped semiconductor surface.

FIG. 3a shows a vertical type light emitting device with substantially parallel ELEE elements of length appreciable to the dimension of the light emitting device. In contrast, FIG. 3b show a vertical type light emitting device comprising de-tuned parallel ELEE elements of length substantially smaller than the dimensions of the light emitting device. Preferably, the high reflectivity bottom optical mirror is designed to reflect at least 50%, more preferably at least 75%, 90%, or 95%, an most preferably at least 98% of the light incident on the surface. An example top n-contact layout is depicted in 300. The layout and design of the n-contact may vary depending on the requirements, but it is a purpose of the contact to provide uniform current spreading across the surface of the light emitting device. In the present example, the centre of the contact is preferably approximately 90 microns or 100 microns in size and is designed to accommodate a wire bond for connection to an external electrical wire. In an embodiment of the present invention, the ELEE elements may be designed to extend under the top n-contacts 300. However, in another embodiment, the ELEE elements do not extend under the contacts, thereby allowing for improved adhesion between the top contact metals and the surface of the n-doped semiconductor material.

In another preferred example of the present invention, a transparent current spreading layer is sandwiched between the top n contact 300 and the surface of the n-doped semiconductor surface 301, as shown in the cross section through the contact region depicted by the insert in FIG. 3a. This layer may comprise of, but is not limited to, a transparent conductive metal oxide or nitride, ITO, Aluminium doped ZnO (AZO), Ga doped ZnO (GZO), a conductive polymer and Carbon nanotubes (CNT).

In an alternative arrangement, the transparent conductive layer may also comprise a complex optically reflective multilayer stack that is optimised to reflect light emitted inside the light emitting device back into the structure and to minimise optical loss due to the absorption in the metal contacts. The multilayer stack may be designed using methods such as, but not limited to, transfer matrix methods or plane wave expansion methods and may be optimised to also act as an Omni-directional Optical reflector (ODR), Fabry-Perot reflection coating, quarter-wavelength stack, Rugate reflective coating or a Distributed Bragg Reflector (BDR).

Alternatively, an electrically non-conductive dielectric single layer or multilayer stack embedded with an array of electrically conductive via elements joining the metal contacts with the semiconductor material 300 can be incorporated. The metal contact can be further selected from a group of highly reflective metals at the emission wavelength, such as, but not limited to, Ag, Al or Rh for blue wavelength GaN LEDs.

A similar transparent conductive layer or multilayer can also be introduced across at least a portion of the surface between the p-doped semiconductor layer and the p-contact reflective surface. These top surface and bottom surface transparent conductive layers provide combined high current spreading properties, but most importantly they provide greatly improved optical reflectivity for both contact 300 and the bottom p-contact optical mirror, resulting in minimal optical loss via the trapped waveguide light confined in the high refractive index semiconductor material. The optical reflectivity of the combined transparent conductive layer and the p or n contact for light incident on the respective surface is preferably at least 50%, more preferably at least 75%, 90%, or 95%, and most preferably at least 98%.

In another implementation of the present invention, the ELEE are arranged to be substantially parallel along two basis axes, which may be either orthogonal or non-orthogonal. This allows the far field profile to exhibit a largely isotropic emission along the azimuthal axis, but a substantially wider emission than Lambertian in the elevation axis.

In one preferred embodiment of the present invention, the ELEE is arranged so that the elongate elements associated with the different orthogonal or non-orthogonal basis axes overlap to form a complex network of crossed elongate elements. Some example light emitting devices of the present invention may include a device with ELEE elements having a length appreciable to the dimension of the light emitting device with either a lateral type current path, as shown in FIG. 4a, or a vertical type current path, as shown in FIG. 4b. Other example light emitting devices of the present invention may include a device with ELEE elements having a length substantially smaller than the dimensions of the light emitting device, either with a lateral type device, as shown in FIG. 4c, or a vertical type device, as shown in FIG. 4d. This allows the far field profile to exhibit a largely isotropic emission along the azimuthal axis, as shown in the two cross-sectional far field schematic inset profiles 402 and 403 taken along two different orthogonal directions 400 and 401. It is also indicated that the far field emission profile exhibits a substantially wider emission than Lambertian in the elevation axis, as indicated by 402 and 403. It should be noted that it is an object of the present invention that the ELEE elements provide improved light extraction.

In yet another variant of the present invention, the ELEE elements are introduced on the surface of the light emitting device surface that is also roughened. This allows the light emitting device to exhibit improved light extraction, as compared to a device that is simply roughened. Examples of such devices are shown in plan view in FIGS. 5a to 5d. It is noted that the features are not drawn to scale and that the grey pyramidal roughening features in FIGS. 5a and 5c are typically smaller than the grey features shown in FIGS. 5b and 5d.

Figures 5A, 5B:
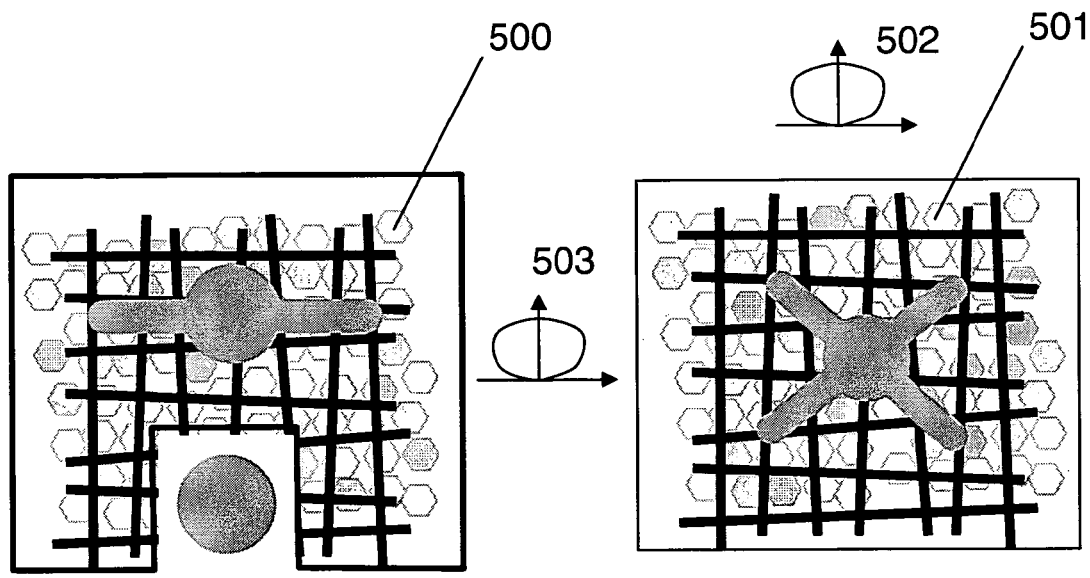
FIGS. 5a-d show a schematic plan view of example light emitting devices of both lateral and vertical current flow type with an array of crossed elongate light extraction elements superimposed on top surface roughening.
Figures 5C, 5D:
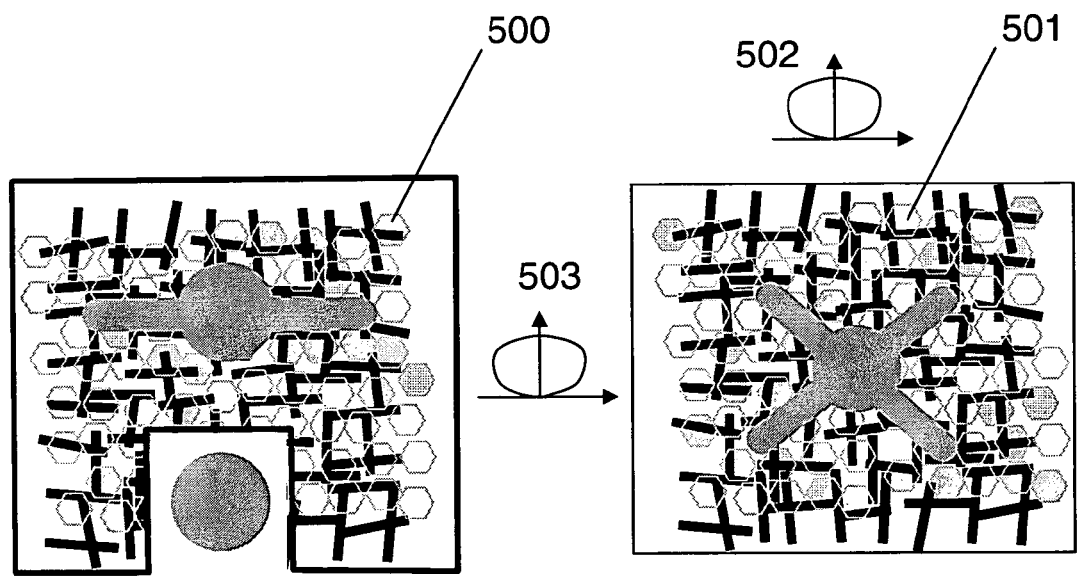

FIGS. 5a and 5c show a lateral type light emitting device with ELEE elements introduced on the top roughened surface of a p-doped semiconductor light emitting device. The roughened surface may comprise, but is not limited to, epitaxially grown randomly arranged inverted pyramids, 500, forming indentations on the surface of the light emitting device. These are typically between 100 nm and 600 nm and do not penetrate into the light emitting region of the device. As shown in FIGS. 5b and 5d, in the case of a vertical type light emitting device, the randomly arranged pyramids typically comprise, but are not restricted to, protruding pyramids, 501, wet etched into the top surface of the n doped light emitting device. As the n-doped semiconductor material of a light emitting device is much thicker (approximately around 4 to 5 microns), this allows much larger protruding pyramids of sizes ranging from 1 to 3 microns to be formed on the top surface.

The far field profile of such devices exhibit a largely isotropic emission along the azimuthal axis as well as an elevation profile closer to a Lambertian. A cross section of the far field profile in both orthogonal directions is indicated by the two inserts 502 and 503. In these implementations of the invention, the etch depth of the ELEE elements are allowed to be at least deeper than those of the roughened features to provide for stronger optical interaction between the trapped waveguide modes and the ELEE elements. The surface of the roughened light emitting device is not restricted to inverted and protruding pyramids and may also include selectively grown or etched columnar features or cluster formations on the surface.

Figure 6A:
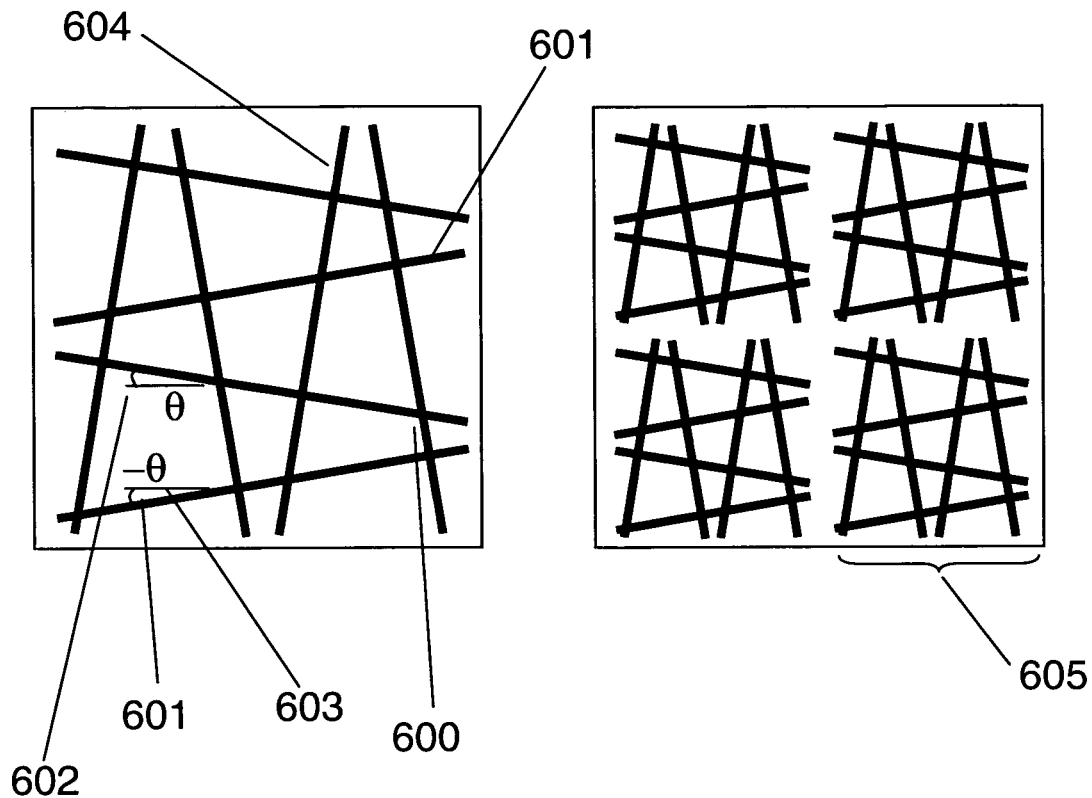
FIGS. 6a-b show a schematic plan view of example light emitting devices with a repeating sub-region comprising an array of crossed elongate light extraction elements.
Figure 6B:
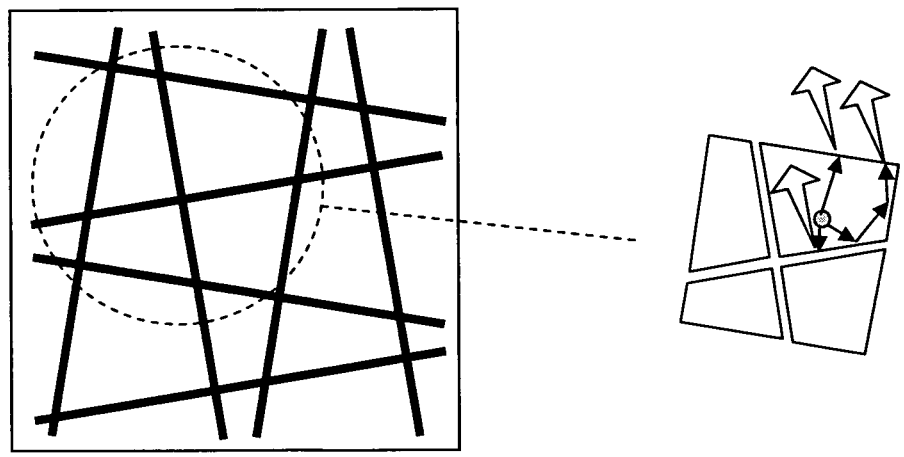

In other embodiments of the present invention, the non-parallel ELEE elements can be arranged in repeating sets across the surface of the light emitting device, as shown in FIGS. 6a and 6b. The left hand side schematic of FIG. 6a shows the case where the long ELEE elements extend along the length of the light emitting device. The ELEE elements are allowed to intersect each other at certain locations, 300, along the two orthogonal axes. It is preferred that the individual ELEE elements are arranged at a slightly de-tuned angle from the orthogonal axes. The de-tuning can range between 0 degrees and 45 degrees from the reference axes. Preferably, the detuning angle is 5 degrees, 10 degrees or 15 degrees. The ELEE elements are arranged in an alternating fashion to allow for greater packing of ELEE elements across the surface of the light emitting device. In one cycle, the ELEE element is defined with a de-tuning of θ degrees away from the axes 603, while in the second cycle the ELEE is defined along a-θ degree de-tuning with respect to the same axes. A similar repeating packing scheme is carried out across the other orthogonal axes as shown by 604.

In another variant of the present invention, the de-tuning repetition can be arbitrarily defined and can follow any predetermined sequence. Also, in a further embodiment of the present invention the sub-regions of ELEE elements, as depicted by the left hand schematic in FIG. 6a, can be repeated across a larger area light emitting device, as shown on the right hand side schematic, 605.

As shown in FIG. 6b, it is preferred that the ELEE elements of the present invention form sub-regions across the surface of the light emitting device in order to break up the optical mode symmetry. The formation of non-parallel sided shapes eliminates the formation of any resonant or standing waves or whispering type gallery modes within sub-regions of the light emitting device and thus improves the probability of light extraction within each sub-region. This is advantageous, as the sub-regions are small with respect to the overall size of light emitting device and therefore enhances the probability of uniform light extraction across the complete top surface of the light emitting device, rather than purely at the mesa edge of the device. The uniform light extraction also ensures that waveguide modes only propagate a short distance prior to light extraction, thereby reducing the material losses experienced by optical modes in the light emitting device. The inset on the right hand side of FIG. 6b highlights the increased probability of light escaping from the top surface by experiencing many facets and also the ability of dipole emitted light (indicated by solid arrows incident on non-parallel sides) to escape within a sub-region(as indicated by the hollow arrows).

Figure 7A:
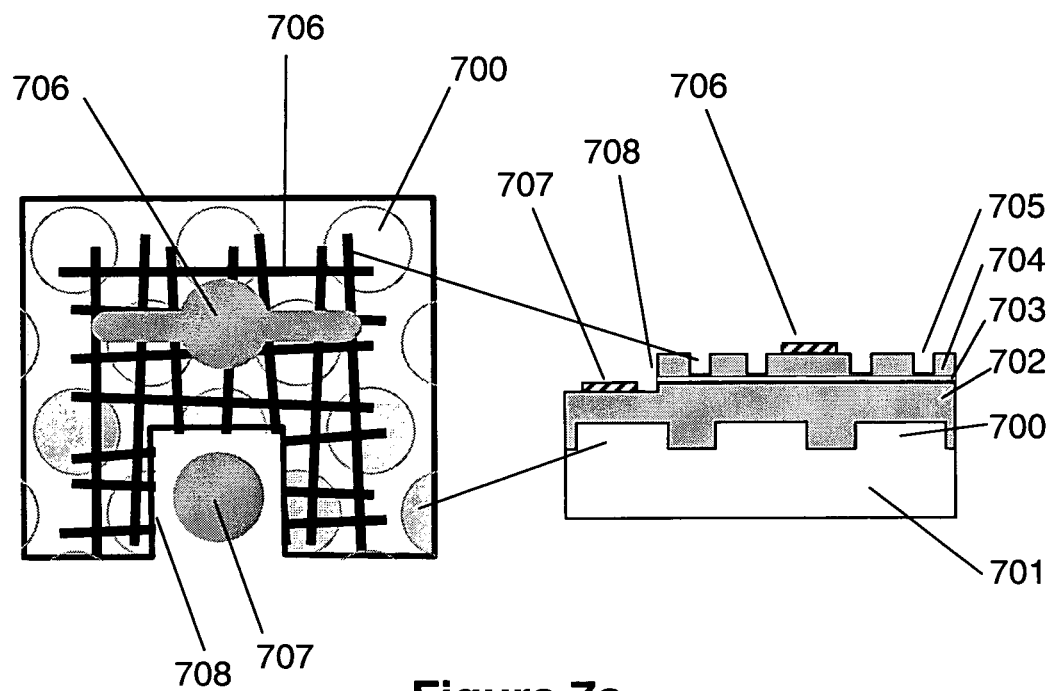
FIGS. 7a-b show a schematic of the plan and cross sectional view of example light emitting devices of the present invention incorporating elongate light extracting elements and a patterned substrate.
Figure 7B:
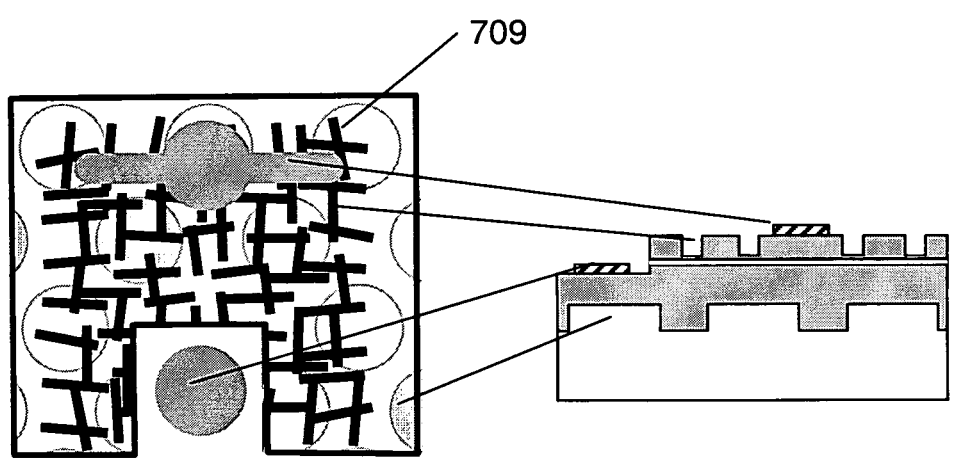

In a preferred implementation of the present invention, the light emitting device is grown on a regularly patterned sapphire or other suitable growth substrate, as indicated by 701 in FIGS. 7a and 7b. The n-doped semiconductor material, 702, is grown using an epitaxial layer overgrowth (ELOG) technique around the typically circular pillars 700. The ELOG technique dramatically reduces the thread dislocation densities of the semiconductor crystal growth, as well as increasing the diffuse reflectivity of the light trapped in the light emitting device core region when light is incident on the bottom surface of layer 702. This increases the probability of the light residing in the escape cone of the light emitting semiconducting material and hence improves the extraction from the top extracting surface. The light emitting layer, 703, is interdisposed between layer 702 and the p doped semiconductor layer 704.

The ELEE elements, 705, are defined in layer 704 and are not allowed to penetrate the light emitting layer 703. In the present light emitting device, the ELEE elements allow improved light extraction by introducing an additional means of coupling waveguide modes into leaky escape modes, as well as shortening the light extraction coupling length of the device, which helps to reduce any loss experienced by trapped modes due to absorption in the materials. The bottom n contact 707 is deposited on the n-doped semiconductor material 702, and hence is defined within an etched trench 708, while the top p contact 706 is defined on layer 704.

In the example shown in FIG. 7a, the ELEE elements 705 extend a distance greater than at least a sizeable portion of the length of the active light emitting device. Preferably, the ELEE elements 705 extend a distance greater than ⅛, more preferably ⅙, and most preferably ¼ of the length of the active light emitting device. In the example shown in FIG. 7b, the ELEE elements 709 extend a substantially shorter distance than the length of the active light emitting device. Preferably, the ELEE elements 709 extend a distance of less than ⅛, more preferably less than ⅙, and most preferably less than ¼ of the length of the active light emitting device.

Figure 8A:
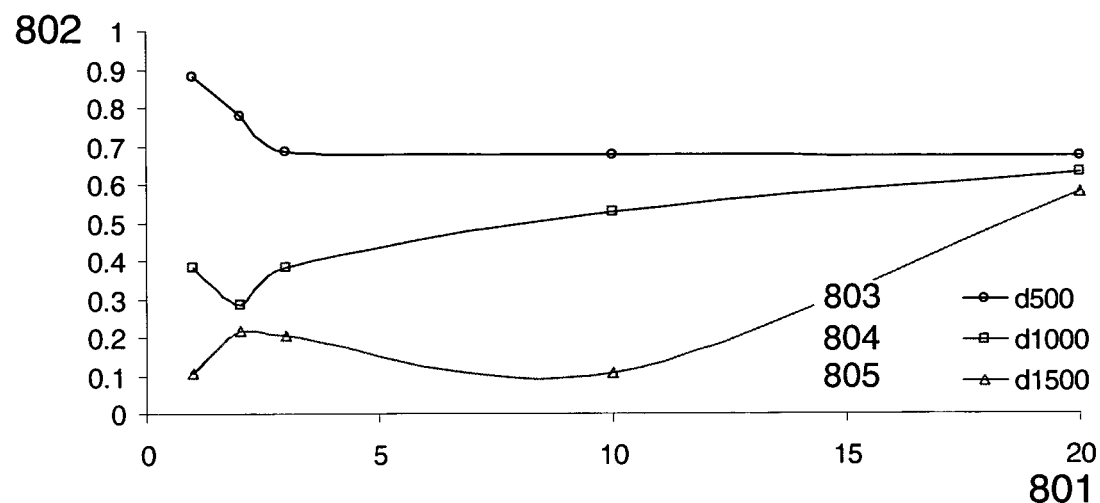
FIGS. 8a-d show the results of Finite Difference Time Domain simulations analyzing the light trapped in a light emitting device with elongate light extraction elements.

In order to demonstrate the light extraction efficiency of the ELEE elements, exemplary light emitting devices were simulated using a Finite Difference Time Domain (FDTD) modelling. In the first example, the light extraction efficiency of a single ELEE element for individual TE waveguide modes trapped in a GaN blue light emitting device of 4 microns thickness residing on a sapphire substrate is analysed. The graph of FIG. 8a shows the calculated light 802 residing in the waveguide mode as a function of TE waveguide mode 801. The calculation is relative to a control light emitting device with no ELEE elements and a smooth top emitting surface. A greater amount of light in the waveguide indicates lower extraction efficiency. In the present case, the light is assumed to propagate at normal incidence to the elongate edge of the ELEE elements (termed width), and the etch length of the ELEE (termed length) is fixed at 500 nm for all simulations. It is also assumed that the ELEE width is much larger than the etch length and depth and is at least 3 microns, 5 microns, 10 microns, 25 microns or 50 microns.

In the first example, the weakest light extraction efficiency across all waveguide modes was experienced by ELEE elements with an etch depth of 500 nm, depicted by 803 in FIG. 8a. Stronger light extraction is experienced by all waveguide modes when the etch depth is increased to 1000 nm, as indicated by 804, and the strongest light extraction is observed for the deepest etch depth of 1500 nm, as indicated by 805. A general trend for all ELEE dimensions can also be seen, whereby the light extraction efficiency generally drops with increasing waveguide mode angle, this is most clearly visible with increasing ELEE etch depths.

Figure 8B:
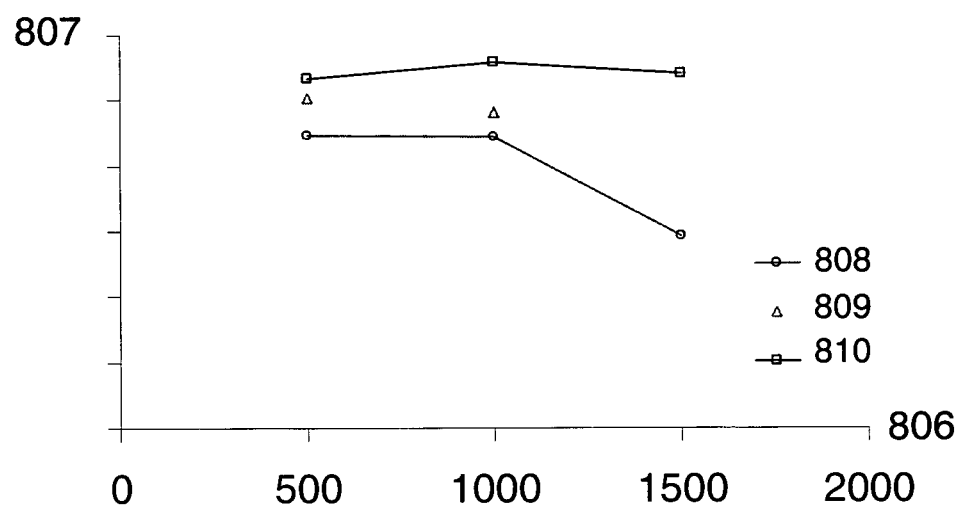

The normalised arbitrary light trapped in the core for all trapped waveguide modes was also analysed for different single ELEE elements. The graph of FIG. 8b shows the results of simulations, with the total trapped light 807 plotted against etch depth (in micron). In the present example, with a thickness of 4 micron, approximately 33 TE and 33 TM modes are trapped in the waveguiding structure. In order to determine the light extraction efficiency, an integration of all trapped waveguide modes is performed. The etch depth 806 is varied between 500 nm and 1500 nm and simulations are performed for etch lengths of 500 nm, 1000 nm and 1500 nm, as shown at 808, 809 and 810, respectively. The light extraction is normalised to a control light emitting device with no ELEE elements and a smooth top emitting surface.

It is important to note that, during the simulations, the calculated trapped light in the waveguide takes account of the energy in all transmitted waveguide modes and also back reflected waveguide modes. Hence, a drop in the trapped light is a direct indication of an increase in light extraction efficiency. The graph of FIG. 8b clearly highlights the increase in light extraction as the ELEE element length is reduced towards 500 nm, while also showing strong indication of improved light extraction as etch depth is increased towards 1500 nm.

Figure 8C:
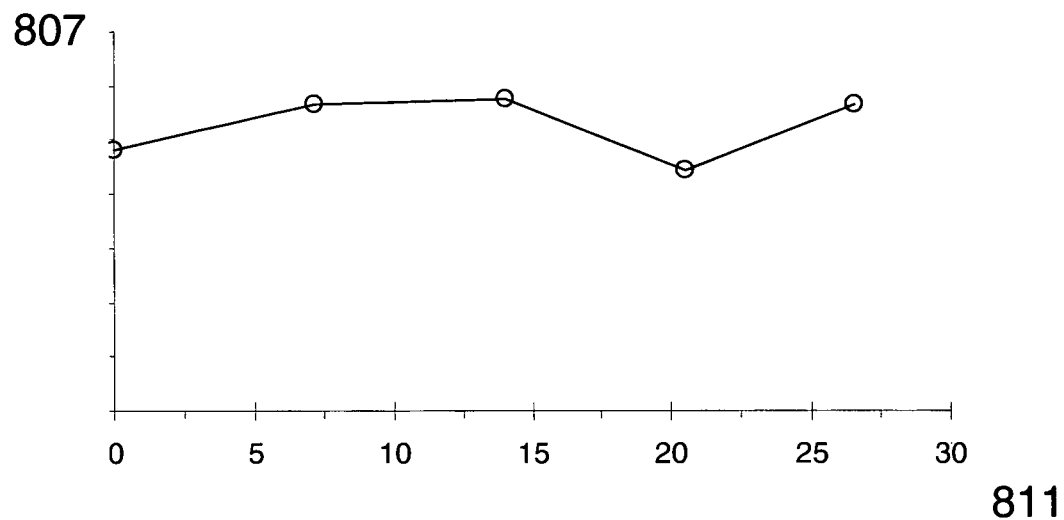

The ELEE elements can comprise of any arbitrary cross sectional shape. The graph of FIG. 8c shows the calculated trapped light 807 in a light emitting device with a single ELEE element against varying angle 811 of the sidewall etch. In this example, the ELEE structure is fixed with a length of 500 nm and an etch depth of 1500 nm, and the sidewall angle is varied between 0 degrees and 26.5 degrees. The greatest improvement in light extraction is generally when the ELEE elements have straight sidewalls or when the etch angle is approximately 20 degrees from the normal to the top surface of the light emitting device. In other embodiments of the present invention, the indentation or sidewall etch angle of the ELEE element can be tailored to improve both light extraction and for alteration of the far field emission profile.

Figure 8D:
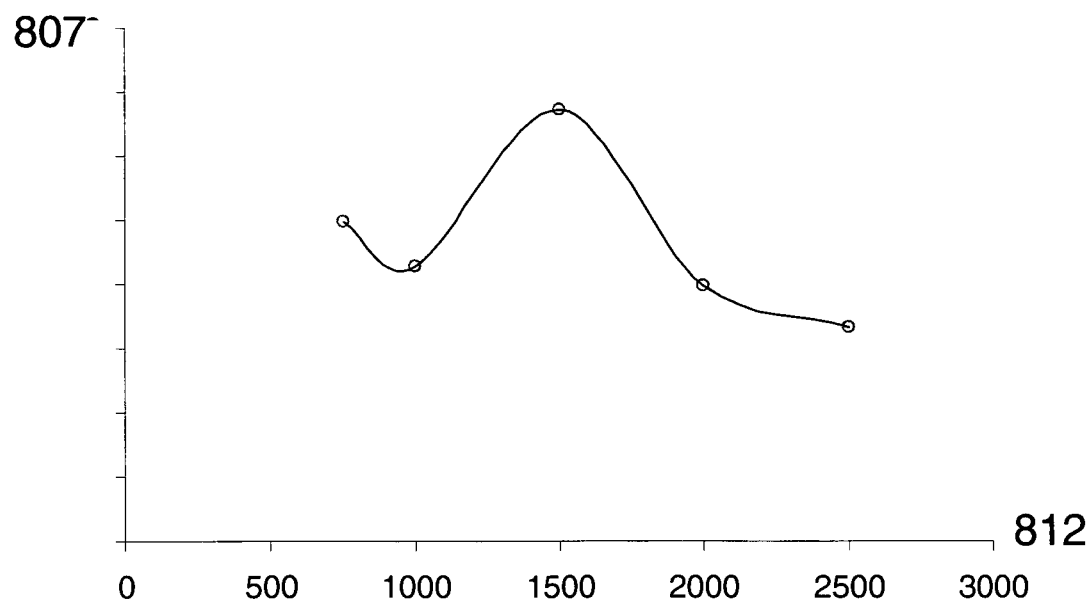

It is an object of the present invention that the light extraction is achieved by individual ELEE elements and not the combined interaction between neighbouring ELEE elements. This allows greater control of light extraction and greatly relaxes fabrication tolerances. FIG. 8d shows the result of the interaction between two neighbouring ELEE elements of the same dimensions, with their spacing 812 varying between 750 nm and 2500 nm. The ELEE elements are fixed at length 500 nm and depth 1500 nm and the light 807 trapped in the waveguide is monitored. At a spacing of between 750 nm and 2000 nm it is clear that interactions between the neighbouring ELEE are visible, as evidenced by the light extraction increasing at approximately 800 nm spacing and sharply dipping at around 1500 nm spacing. However, as the spacing increases past 2000 nm the light trapping/extraction level becomes relatively constant, which is an indication that neighbouring ELEE elements are no longer interacting with each other.

Figure 9A:
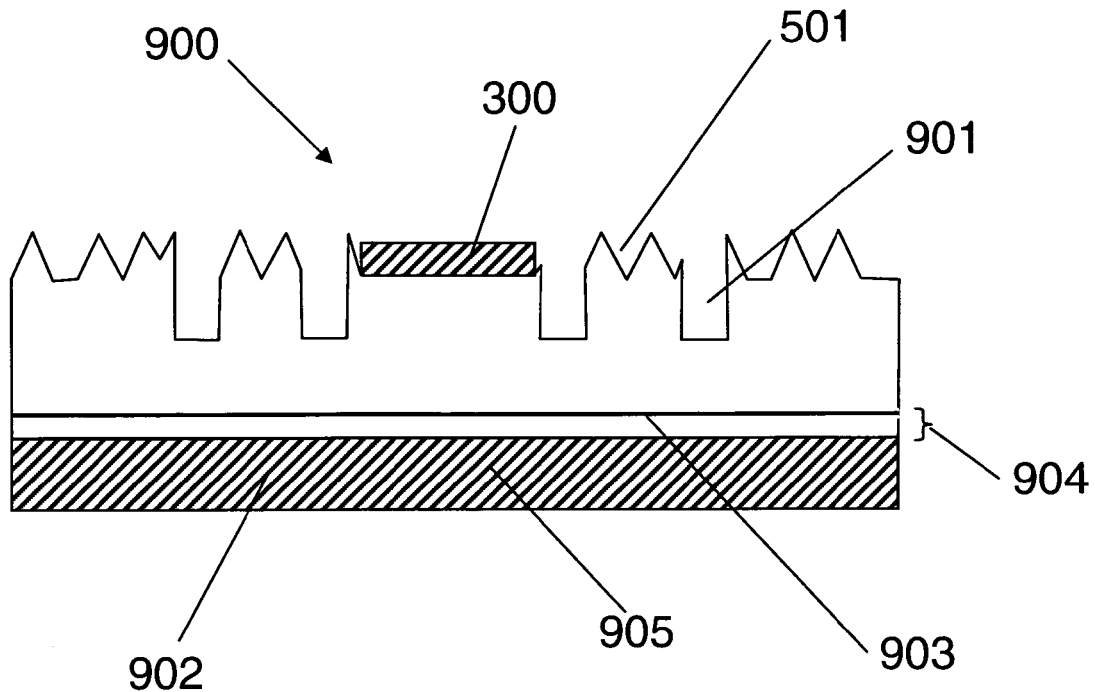
FIG. 9a shows a schematic of the cross sectional view of an example vertical current type light emitting device of the present invention incorporating elongate light extracting elements on the top emitting surface and a bottom reflective mirror to give rise to an optical cavity.
Figure 9B:
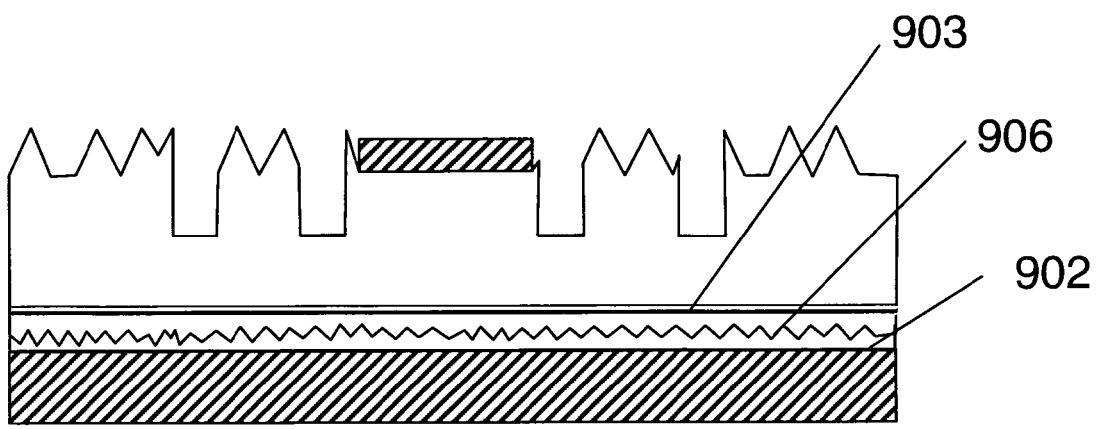
FIG. 9b shows a schematic of the cross sectional view of an example vertical current type light emitting device of the present invention incorporating elongate light extracting elements on the top emitting surface and a roughened surface disposed between the light emitting region and the bottom reflective mirror.

FIGS. 9a and 9b show a cross section of a vertical type light emitting device, 900 with a roughened top surface 501. The top n contact 300, the bottom p contact 905, and the optical mirror surface 902 are indicated. A light emitting layer, 903, is disposed between the n- and p-doped semiconductor material and the ELEE elements, 901, are formed on the top surface of the device. An optical cavity effect can be formed by finely controlling the spacing, 904, between the optical mirror 902 and the light emitting region 903. The light emitting region is typically a multiple quantum well, a single or double heterojunction or quantum dots. During operation the forward emitted light interferes with the reflected light (from layer 902) and alters the dipole emission profile inside the light emitting region.

In one embodiment of the present invention, the spacing 904 is optimised for maximum light extraction out of the top surface of the light emitting device. In another embodiment of the present invention, as shown in FIG. 9b, a diffuse roughening layer, 906, is introduced between the light emitting region 903 and the optical mirror surface 902. The diffuse layer acts as a specular scattering centre for light prior to incidence on the optical mirror. This in turn increases the probability of the light being redirected to angles that reside in the light escape cone of the semiconductor material and hence increases the light extraction efficiency.

Figure 10:
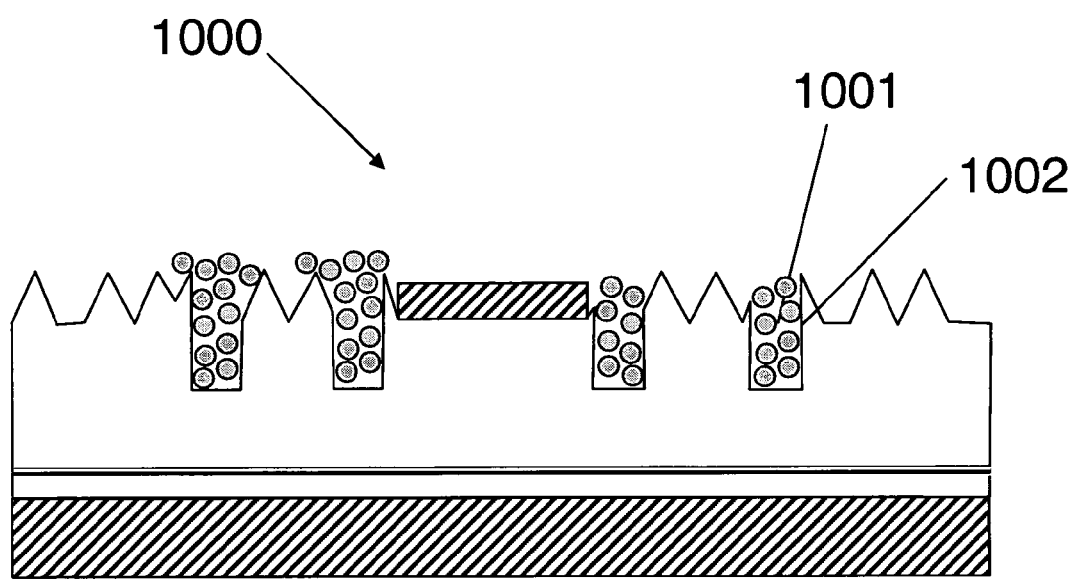
FIG. 10 shows a schematic of the cross sectional view of an example vertical current type light emitting device of the present invention incorporating elongate light extracting elements on the top emitting surface and further comprising scattering elements disposed inside the ELEE elements.

As shown in FIG. 10, in another adaptation of the present invention, the light extraction capabilities of the ELEE elements are further improved by disposing scattering elements, 1001, inside the ELEE elements, 1002. These scattering elements may comprise colloids, nanospheres, nanorods, macroporous structures, nanoclusters and other scattering elements of arbitrary shape that have dimensions comparable to the effective wavelength of the emitted light. The dimensions of scatterers can range from approximately 50 nm to approximately the wavelength of light. Some examples of materials that can be employed include $SiO_2$, $Si_3N_4$, $TiO_2$. Additionally, the scatterers can also incorporate a wavelength conversion element, such as, but not limited to, a Yellow Phosphor for white light applications when used in conjunction with a blue GaN LED.

We now examine the optical cavity effect in more detail. FIG. 11a shows a typical cross sectional dipole emission which arises from an optimised structure. In order to determine the interference pattern residing in the light emitting region the following expression is solved $$|E|^2 = \alpha_p^2 + \alpha_r^2 + 2\alpha_p\alpha_r \cos(\pi + \phi + \phi') \quad (2)$$

where E is the Electromagnetic field profile residing in the light emitting device, $\alpha_p$ is the amplitude of the emitting light, $\alpha_r$ is the amplitude of the reflected light, $\phi$ is the phase shift due to reflections from the optical mirror 902 and $\phi'$ is the phase shift due to the optical path length difference. The phase shift $\phi$ is determined by a method such as the transfer matrix method for a complex mirror structure or a simple Fresnel reflection equation for a single metal mirror or other similar technique. Subsequently $\phi'$ can be determined by the following expression $$\phi' = \frac{4\pi d \cos\theta}{\lambda_{LED}} \quad (3)$$

where d is the separation distance, 1104, between the light emitting region and the optical mirror. The angle of the photon from the normal to the mirror surface is defined by $\theta$, while the effective wavelength in the light emitting device is defined by $\lambda_{LED}$.

The resulting emission profile is indicated in FIG. 11a by 1100 and it can be seen that the majority of the emission resides within the light escape cone of the material 1101. This gives rise to improved light extraction, 1102, from the top surface of a smooth unroughened light emitting device. Minimal light, 1103, is emitted into the waveguide region due to the selected optical cavity spacing 1104. In the case of an un-optimised optical cavity, as shown in FIG. 11b, the majority of the dipole emission resides outside the light escape cone, 1105 and minimal light is extracted, 1106, out of the light emitting device. However, as shown in FIG. 11c, when an ELEE element is introduced on to the surface of the light emitting device with an optimised optical cavity, the light extraction is increased and more light escapes in the vicinity of the ELEE element, 1107. The extracted light far field emission profile 1108 arising from such as device is substantially Lambertian in the elevation angle.

In another preferred embodiment of the present invention, shown in FIG. 11d, the un-optimised optical cavity is selected to substantially emit dipole light outside the escape cone, 1109. This is typically not desirable in a conventional vertical LED designs employing roughening for light extraction. In this case, the energy is redistributed between the different guided modes and more energy is coupled into lower order waveguide modes. However, in the present example, the ELEE elements are optimised to efficiently extract such waveguide modes, 1110, that are trapped by the optical cavity. Minimal light escapes from the top smooth unroughened surface of the light emitting device, 1106, and the majority of the light escapes in the vicinity of the ELEE elements. This device provides advantages in that the light extracted by the ELEE elements constitutes of a set of trapped waveguides that are of a shallower mode angle than those present in the device shown in FIG. 11c. In the present embodiment, the extracted light will also escape at a much shallower elevation angle with respect to the top surface of the LED. This allows a large tailoring of the far field emission profile of the light emitting device with profiles substantially wider than a Lambertian being achieved, as shown at 1111.

In a preferred embodiment of the present invention, the light extracting elements are introduced on the surface of a substantially polarised light emitting device, such as, but not limited to, a non-polar GaN light emitting device. In the preferred embodiment, the ELEE elements are optimised to extract one specific polarisation such as the TE polarised waveguide mode. The selected polarisation is matched with the dominant emission polarisation of light emitting device and thus allows for greatly improved light extraction efficiency.

Example non-polar light emitting devices can be grown on Free Standing m-plane GaN substrates, or a-plane non-polar GaN on r-plane Sapphire substrates as well as nonpolar m-plane GaN on gamma plane LiAlO substrates. Typical non-polar light emitting devices exhibit polarisation selectivity of approximately 75%, 80% or 85%. It is also noted that such devices lend themselves directly to applications such as LED BLU applications for LCD panels, where the polarisation selectivity can potentially provide improvements of around an order in the efficiency of LCD display. In such an application, the LCD polariser can transmit more than 50% of the light from an LED of the present invention through the LCD on the first incidence of the light without the use of complex light cycling techniques, which are typically hindered by high losses. This may potentially lead to LCD displays with efficiencies greater than 50%.

It was previously mentioned that the ELEE elements can comprise etched indentations with angled sidewalls. In yet another implementation of the present invention, the cross sectional profile of the ELEE elements can be arbitrarily defined. This may include polygons, ellipses, or any other shape or multiple shapes. The use of such profiling can provide improvements in both light extraction efficiency, as was shown in FIG. 8c, and variable far field emission profiles, and can additionally provide a means for a simplified method of manufacture.

Figure 12A:
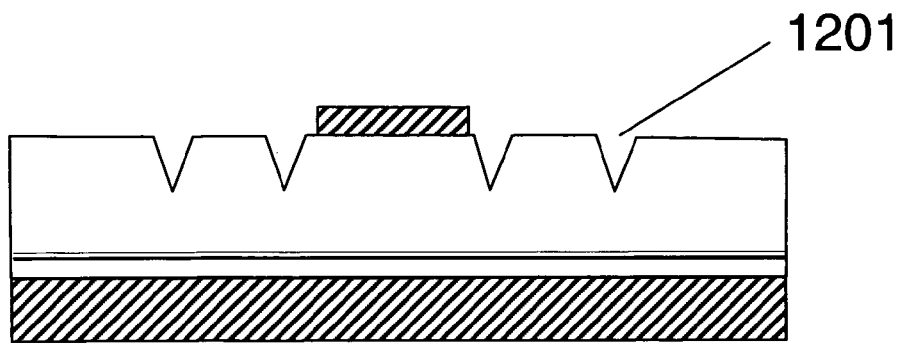
FIGS. 12a-c show a schematic of the cross sectional view of an example vertical current type light emitting device of the present invention incorporating elongate light extracting elements on the top emitting surface and further comprising arbitrary shaped element cross sections; and, FIGS. 13a-g show an illustration of the processing steps performed in the fabrication of a vertical type light emitting diode of the present invention.
Figure 12B:
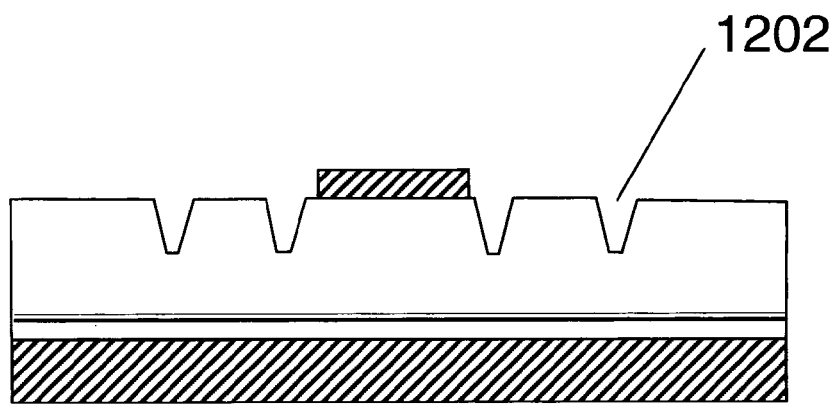
Figure 12C:
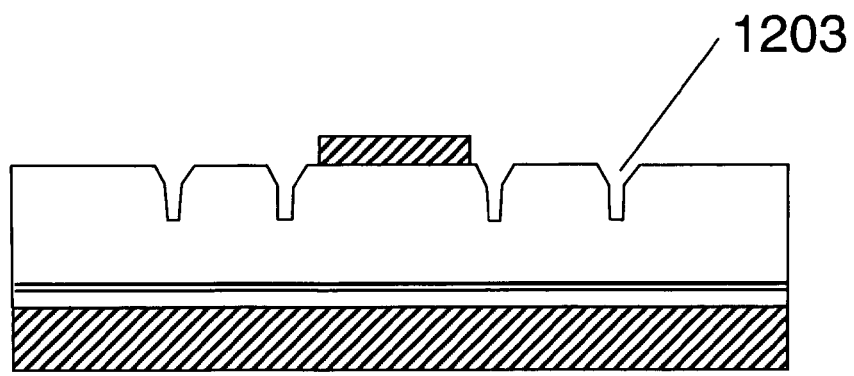

FIG. 12a shows how triangular cross section profile ELEE elements, 1201, are defined and etched into the light emitting device top surface. These can typically be fabricated using an anisotropic wet etching technique, which etches the semiconductor material along the crystal planes forming triangular sidewalls. In another example the sidewalls can form an angled facet, 1202, as shown in FIG. 12b, and can be fabricated using dry etching techniques. Alternatively, as shown in FIG. 12c, a cross sectional profile comprising a more complex polygon shape may be employed, 1203. In the present example, a dry etch technique may be employed to define a double angled sidewall structure. It is further noted that the shape of the ELEE elements, when viewed from the top, can also be arbitrarily defined, and may include exemplary shapes such as rectangular, rhombus, polygonal, elliptical or rounded edge rectangles, although other shapes are possible.

Method of Manufacture

In another aspect of the present invention, a method of manufacture of a vertical LED structure with ELEE light extraction elements is proposed.

Figure 13A:
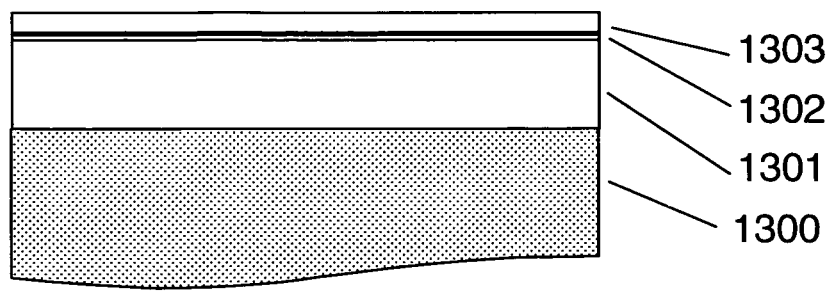

FIG. 13a shows an example GaN based LED epitaxially grown on a suitable growth wafer 1300. The growth wafer can comprise, but is not limited to, Sapphire, Silicon Carbide, free-standing GaN or any other lattice matched material. The growth wafer may also comprise Si, which is particularly beneficial when moving to larger six inch wafer diameters.

As shown in FIG. 13a, the LED device comprises at least n-type semiconductor layer 1301, followed by an active light emitting region 1302, subsequently followed by a top p-doped semiconductor material 1303. The active region 1302 can comprise a single quantum well (QW) region or multiple quantum wells (MQW) or a double heterojunction (DH). These layers are grown by conventional semiconductor growth techniques such as metal organic vapour phase epitaxy (MOCVD) or molecular beam epitaxy (MBE), or alternatively atomic layer deposition (ALD).

In the case of n-GaN layer 1301, the layer can have a thickness of about 0.5 µm, about 1.5 µm, about 2.0 µm, about 2.5 µm, about 3 µm and about 4 µm. The MQW region 1302 can comprise InGaN/GaN or AlGaN/GaN multilayer stacks. When these layers are forward biased, they can emit light in the region between 240 nm and 680 nm. In the case of the p-doped GaN layer, the thickness can vary between 5 nm and 400 nm, and is preferably about 50 nm, about 100 nm, about 150 nm, or about 180 nm. It is important to note that the structure will be inverted for a vertical type structure and hence the top surface as shown will reside at the bottom of the device once the processing steps are complete.

Figure 13B:
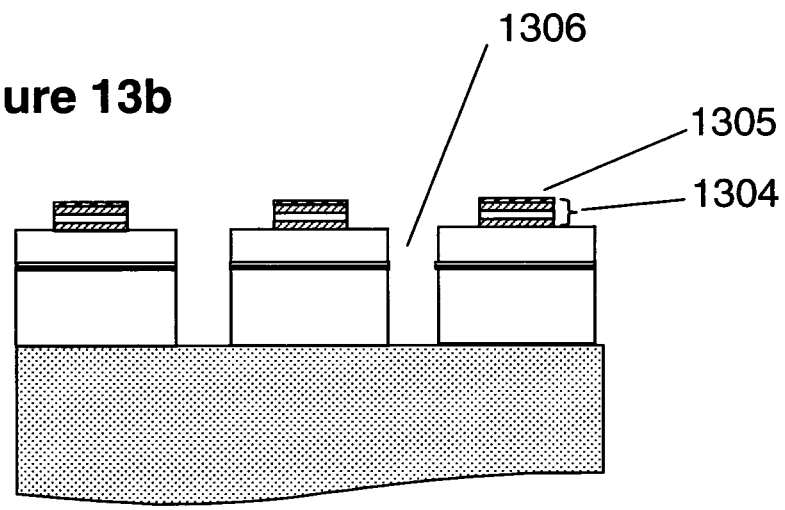

As shown in FIG. 13b, a bottom transparent conductive layer, metal contact and optical mirror stack is deposited. This can be carried out by any conventional deposition technique, such as, but not limited to, any chemical vapour deposition technique (CVD), such as low-pressure chemical vapour deposition (LPCVD), plasma-enhanced chemical vapour deposition (PECVD), atomic layer deposition (ALD), or other techniques such as sputtering or evaporation. A first metallic low resistivity contact layer 1305 is subsequently deposited on the structure. This layer also acts as a good adhesion layer between the metal permanent substrate and the underlying p-doped GaN or semiconductor region. This contact region is preferably formed of one or more of Ni/Au, Ti/Au, Cr/Au, Au, Pd, Pt, Ru, Ni, Cr, ZnO, CNT, Ag, ITO, Al, and W, although other materials are possible. Additional conductive adhesion metal layers are also introduced to act as high reflectivity layers 1304, which reside between layer 1305 and the p-GaN region 1303.

The bottom contact region is defined lithographically and transferred into the transparent conductive layer and the metals, as shown in 1304 and 1305. The bottom contact region pattern may be etched by any etching technique suitable for materials residing in layers 1304 and 1305, such as, but not limited to, wet etching or plasma etching including reactive ion etching (RIE) and inductively coupled plasma (ICP). Following the definition of the bottom contact, the LED die regions are defined lithographically and etched to form trenches, 1306, thereby isolating the individual LED die. The formation of the individual LED die prior to flip chip and growth wafer removal allows improved stress relief.

Figure 13C:
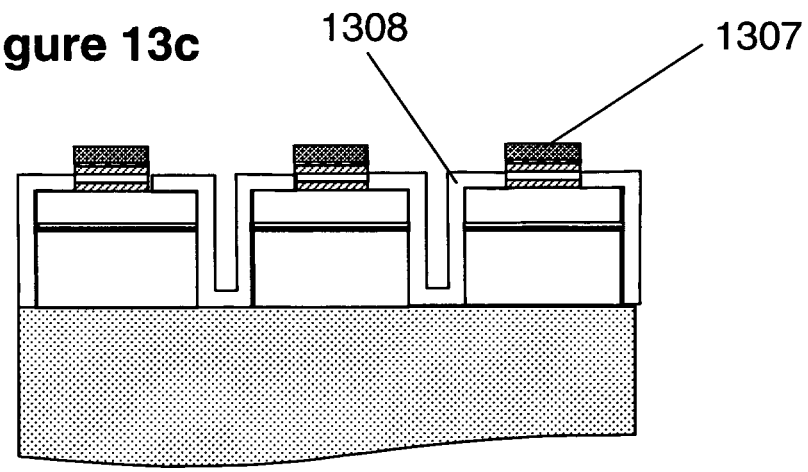

A passivation layer 1308 is allowed to fill and overcoat the trenches 1306 as shown in FIG. 13c. The passivation layer may comprise $SiO_2$, $Si_3N_4$, polymer or spin-on-glass, but other materials are possible. Subsequently, a metal seed layer 1307 is grown on top of the adhesion layer 1305. The passivation layer acts to protect the GaN from environmental factors as well as avoiding the conductive seed layer shorting the LED structure. Layer 1307 provides the seeding for any subsequent chemical plating process. This layer can comprise metals such as Cr, Cu, Pt, Au, Ag, Ti, Ni, and Pd.

Figure 13D:
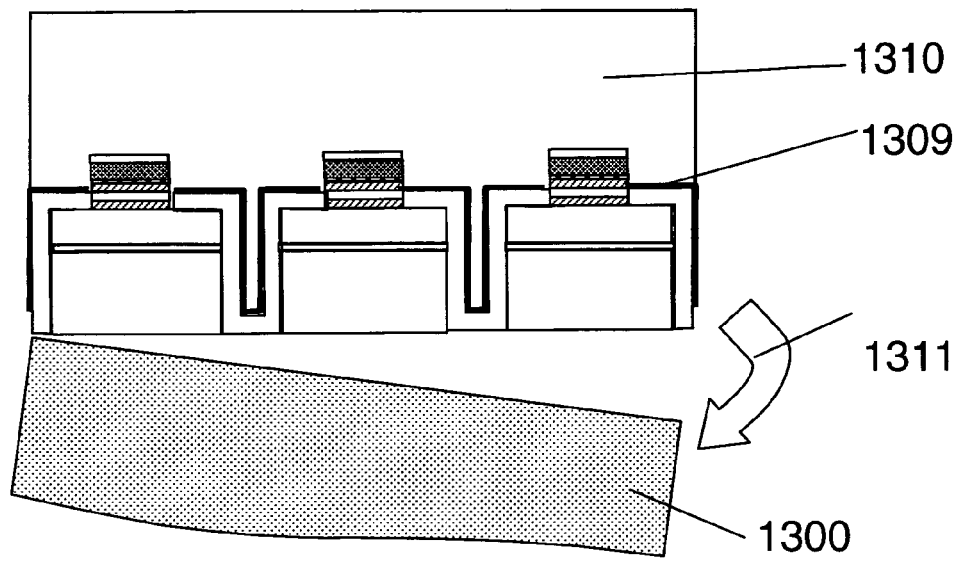

As shown in FIG. 13d, an additional metal adhesion layer 1309 may optionally be deposited on the top surface of the passivation layer 1308. The material for this layer can be selected from the same metals suitable for layer 1305. Following deposition of the optional layer 1309, the carrier metal substrate layer 1310 is overgrown. This layer may comprise one of, or a mixture of, Au, Cu, Ni, Cr, Pt, Pd, In, Al, and W, although other materials are possible. The metal is grown by evaporation, sputtering, electroplating or electro-less plating. A thick layer of metal is formed, which is preferably approximately 20 µm, approximately 50 µm, approximately 100 µm or approximately 150 µm thick. This thick layer 1310 provides a rigid support to hold the underlying LED die during removal of the growth substrate 1300. The removal process can be performed by a selective etching process, a lift-off process such as laser lift-off, wet etching, ICP etching or a polishing method. A combination of such devices can also be implemented. Following removal of the growth substrate 1300, the LED dies are flipped as shown in FIG. 13e.

Figure 13E:
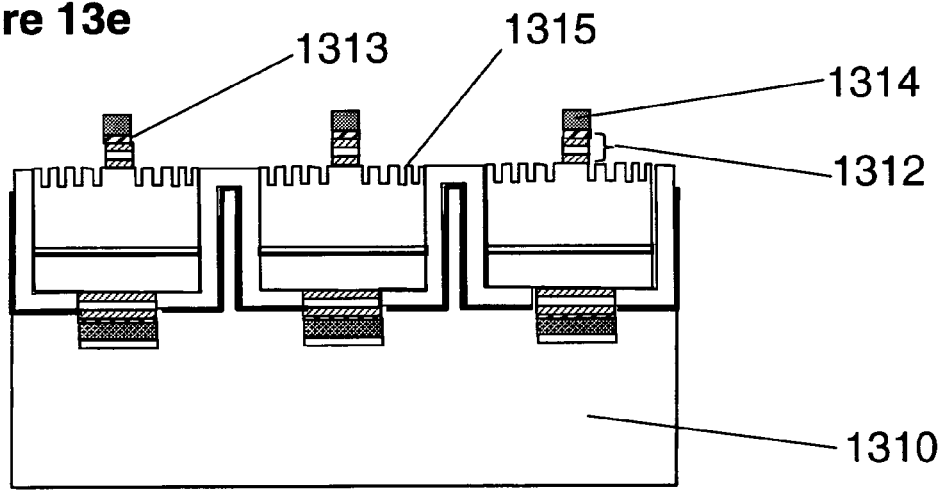

As shown in FIG. 13e, the new permanent carrier is now the thick metal layer 1310, and the n-doped GaN or semiconductor material is the top exposed surface. The ELEE elements, 1315, are defined using the deposition of a thin layer of hard mask, typically 50 nm to 100 nm of $SiO_2$ (or other dielectric such as $Si_3N_4$) followed by a lithographic expose and developing step (or other alternative technique such as imprint) for pattern definition, and subsequent pattern transfer into the hard mask by using a dry etch. The pattern is then transferred into the top surface of the LED using a GaN ICP or RIE dry etch or a wet etch using an alkali such as KOH or other etch technique. The hard mask is then removed and the top conductive contact stack deposited.

The different layers in the contact and mirror stack are successively deposited using processes similar to those utilised for the bottom contact and reflector. Subsequently an adhesion layer is also deposited to assist with the bonding of the final top metal contact. An additional lithography and etch step is required at this stage to define the shape of the top contact stack. This will comprise similar processing steps to those of 1304. Other ELEE feature definition techniques may also be employed and may comprise one of the following lithography techniques: standard photolithography, UV, deep UV, X-ray lithography or non-photolithography techniques such as nano-imprinting or colloidal templating.

A method of manufacture of a light emitting device containing ELEE elements is proposed. The ELEE elements can be defined using either dry or wet etching. The pattern location and rotation orientation of the ELEE elements is defined using standard photolithography methods, or UV, deep UV, X-ray lithography or non-photolithography techniques such as nano-imprinting or colloidal templating.

Figure 13F:
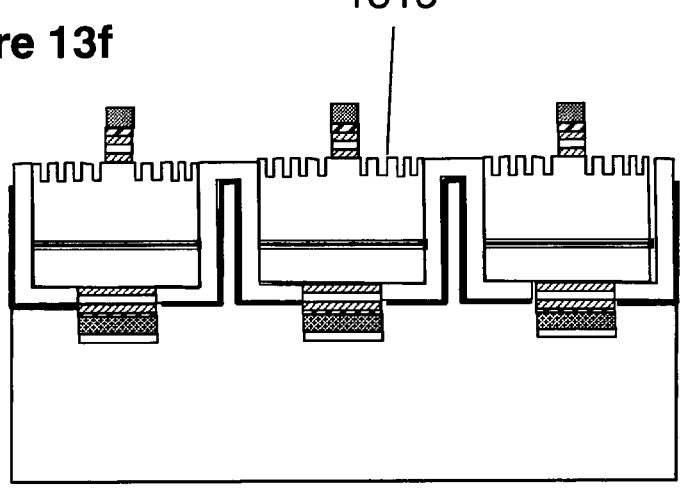

Finally, as shown in FIG. 13*e*, an n-type metal electrode contact pad 1314 is patterned on top of the contact and mirror stack 1312 using a lift-off process. A lithography step and negative resist are employed to deposit the metal conformally on the top surface of the metal stack. A wet or dry plasma etch are used to transfer the pattern into the resist. The resulting structure is shown in FIG. 13*f*, including ELEE elements 1315.

In one embodiment of the present invention the top surface the n-GaN material is further roughened. This can be accomplished by many techniques such as wet anisotropic etching or photo-assisted wet etching. In this case pyramids, inverted pyramids or whisker type roughness following the crystal plane of the GaN are formed by use of chemicals such as, but not limited to, KOH. During wet etching, the concentration, temperature, UV irradiation and biasing of the samples can all be controlled to assist in roughening the surface. The pyramid diameter is preferably between 0.5 µm and 2.5 µm.

Alternatively, optically transparent clusters of high refractive index (preferably larger than n=2.0) material and size approximately 0.5 µm, 1.0 µm, 1.5 µm, or 2.0 µm can also be utilised instead of the wet etching process. Nanoclusters of materials such as $Si_3N_4$ or GaN crystals can be employed to fill the ELEE elements on the surface of the n-GaN to improve light extraction.

Figure 13G:
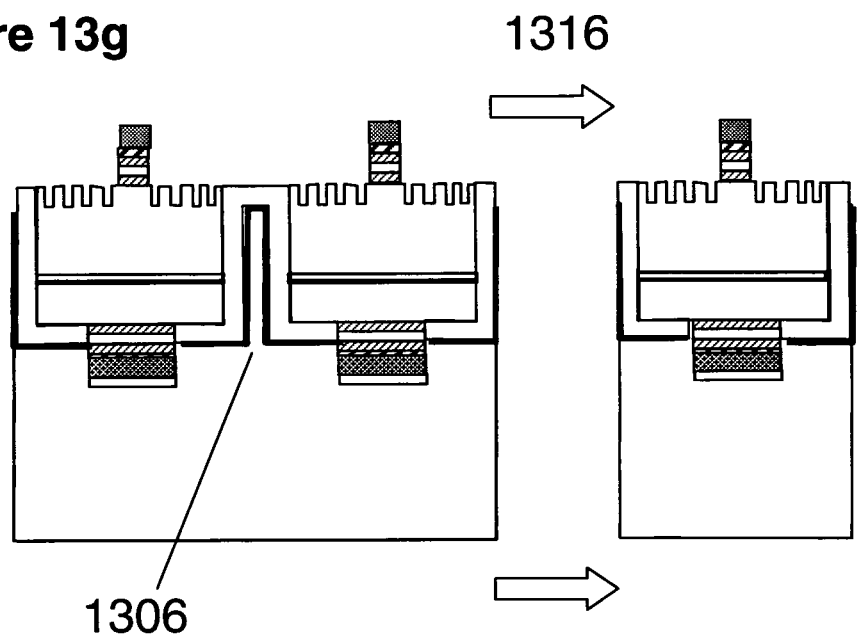

As shown in FIG. 13*g*, the individual LED die are then separated along the trenches 1306. The devices can subsequently be packaged with encapsulant and phosphors to provide solid state lighting modules.

The invention claimed is:

1. A light emitting device comprising:
a first semiconductor layer having doping of a first type;
a second semiconductor layer having doping of a second type;
a light emitting region interdisposed between the first and the second semiconductor layers, wherein light generated in the light emitting region is extracted from the device via an upper surface of the second semiconductor layer, the light generated has a dominant wavelength, and the light generated has an effective wavelength in the device,
a first electrode disposed on the first semiconductor layer;
a second electrode disposed on the second semiconductor layer; and
a first plurality of evenly distributed light extracting elements defined on an upper surface of the second semiconductor layer, the light extracting elements being adapted to couple light out of the device and to modify the far field emission profile of the device; wherein
each of the light extracting elements is an elongate indentation in the upper surface of the second semiconductor layer having length, width, and depth dimensions such that the length of each indentation is at least twice the width of the indentation, the length of each indentation is greater than the effective wavelength of the generated light in the device, and the depth of each indentation extends from the upper surface of the second semiconductor layer in an orthogonal direction thereto but does not extend into the light emitting region;
each elongate indentation in the first plurality has its length dimension oriented at a detuning angle relative to an average direction of the first plurality of elongate indentations, the magnitude of the detuning angle being greater than or equal to 0 degrees and less than 45 degrees, such that at least two elongate indentations in the first plurality are not parallel with one another; and,
each elongate indentation in the first plurality is spatially separated from neighboring elongate indentations in the first plurality such that none of the elongate indentations in the first plurality intersect one another, whereby each indentation in the first plurality perturbs light generated in the light emitting region independently of the neighboring elongate indentations in the first plurality.

2. A light emitting device according to claim 1, wherein the magnitude of the detuning angle is substantially similar for each of the elongate indentations forming the first plurality light extracting elements.

3. A light emitting device according to claim 1, wherein the elongate indentations forming the first plurality of light extracting elements are oriented such that light emitted from the device has an elliptical distribution along the azimuthal axis.

4. A light emitting device according to claim 1, further comprising a second plurality of evenly distributed light extracting elements defined on the upper surface of the second semiconductor layer, the second plurality of light extracting elements being similar to the first plurality of light extracting elements, wherein each elongate indentation in the second plurality has its length dimension oriented at a detuning angle relative to an average direction of the second plurality of elongate indentations, the magnitude of the detuning angle for the first and second plurality of elongate indentations being less than 15 degrees and the average directions of the first and second plurality of elongate indentations being substantially orthogonal to one another such that each elongate indentation in the second plurality intersects an elongate indentation of the first plurality at no more than one location, each elongate indentation in the second plurality is spatially separated from neighboring elongate indentations in the second plurality such that none of the elongate indentations in the second plurality intersect one another, whereby each indentation in the second plurality perturbs light generated in the light emitting region independently of the neighboring elongate indentations in the second plurality.

5. A light emitting device according to claim 1, wherein each elongate indentation has a shape selected from pyramidal, frustro-pyramidal, tapered cuboid, and bevelled cuboid.

6. A light emitting device according to claim 1, wherein each elongate indentation has a transverse cross sectional shape that is one of elliptical, oval, and polygonal.

7. A light emitting device according to claim 1, wherein at least one of the elongate indentations is oriented at a non-zero detuning angle which is equal in magnitude but opposite in sign to that of another of the elongate indentation.

8. A light emitting device according to claim 7, wherein the magnitude of the detuning angle is less than 15 degrees for each of the elongate indentations.

9. A light emitting device according to claim 1, wherein the device has a length and a width and wherein at least one of the elongate indentations has a length greater than one eighth of the length of the device.

10. A light emitting device according to claim 1, wherein all of the elongate indentations have a length greater than one eighth of the length of the device.

11. A light emitting device according to claim 1, wherein the device has a length and a width and wherein all of the elongate indentations have a length less than one quarter of the length of the device.

12. A light emitting device according to claim 1, wherein the length of the elongate indentations is at least 3 microns.

13. A light emitting device according to claim 1, wherein the elongate indentations in the first plurality of light extracting elements are separated on average by at least a minimum of 1.0 micron from neighboring elongate indentations in the first plurality of light extracting elements.

14. A light emitting device according to claim 1, wherein at least a portion of the upper light emitting surface of the second semiconductor layer is partially roughened to increased light emission through the surface.

15. A light emitting device according to claim 14, wherein the depth of any elongate indentations in the partially roughened portion of the second semiconductor layer surface is greater than the depth of the surface roughening.

16. A light emitting device according to claim 1, wherein the first plurality of light extracting elements is defined in a sub-region of the upper surface of the second semiconductor layer, and the first plurality of light extracting elements is substantially repeated in at least one other sub-region of the upper surface of the second semiconductor layer to couple out trapped optical modes residing in the light emitting device.

17. A light emitting device according to claim 1, further comprising an optical mirror having a reflectivity of at least 50% for light incident thereon, wherein the first semiconductor layer is interdisposed between the optical mirror and the light emitting region.

18. A light emitting device according to claim 17, wherein the optical mirror and the light emitting region are configured to give rise to an optical cavity effect therebetween, and wherein the spacing between the optical mirror and the light emitting region is selected to give rise to enhanced coupling of light emission into optical waveguide modes confined in the device and light generated inside the device is at angles substantially outside an escape cone angle of the device.

19. A light emitting device according to claim 1, wherein a surface of at least one mesa side wall of the device is textured so as to enhance light extraction from the device.

20. A light emitting device according to claim 1, further comprising scattering elements disposed in the elongate indentations.

21. A light emitting device according to claim 20, wherein the scattering elements comprise elements selected from colloids, nanospheres, nanorods, macroporous structures, nanoclusters, Silicon Dioxide scatterers, Silicon Nitride scatterers, Titanium Dioxide scatterers and wavelength converting elements.

22. A light emitting device according to claim 4, wherein the elongate indentations in the second plurality of light extracting elements are separated on average by at least a minimum of 1.0 micron from neighboring elongate indentations in the second plurality of light extracting elements.

23. A light emitting device according to claim 4, wherein the second plurality of light extracting elements is defined in a sub-region of the upper surface of the second semiconductor layer, and the second plurality of light extracting elements is substantially repeated in at least one other sub-region of the upper surface of the second semiconductor layer to couple out trapped optical modes residing in the light emitting device.

\* \* \* \* \*